(12) United States Patent
Nishimura et al.

(10) Patent No.: US 11,817,439 B2
(45) Date of Patent: Nov. 14, 2023

(54) SEMICONDUCTOR DEVICE HAVING DISTINGUISHABLE ELECTRODES

(71) Applicant: ROHM CO., LTD., Ukyo-ku Kyoto (JP)

(72) Inventors: Isamu Nishimura, Ukyo-ku Kyoto (JP); Mamoru Yamagami, Ukyo-ku Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/454,897

(22) Filed: Nov. 15, 2021

(65) Prior Publication Data

US 2022/0077124 A1    Mar. 10, 2022

Related U.S. Application Data

(63) Continuation of application No. 16/695,549, filed on Nov. 26, 2019, now Pat. No. 11,211,368.

(30) Foreign Application Priority Data

Nov. 30, 2018  (JP) .................................. 2018-224608

(51) Int. Cl.
  *H01L 23/00*  (2006.01)
  *H01L 25/16*  (2023.01)
  (Continued)

(52) U.S. Cl.
  CPC ............ *H01L 25/16* (2013.01); *H01L 21/486* (2013.01); *H01L 21/4853* (2013.01);
  (Continued)

(58) Field of Classification Search
  CPC ...... H01L 25/16; H01L 24/16; H01L 23/3121; H01L 23/5384; H01L 23/5386;
  (Continued)

(56) References Cited

U.S. PATENT DOCUMENTS

2007/0076392 A1\* 4/2007 Urashima ............... H01L 24/81
    257/E23.07
2007/0242440 A1\* 10/2007 Sugaya ............... H01L 23/3128
    29/832

(Continued)

FOREIGN PATENT DOCUMENTS

JP    2003037239 A    2/2003

*Primary Examiner* — Shahed Ahmed
(74) *Attorney, Agent, or Firm* — HAMRE, SCHUMANN, MUELLER & LARSON, P.C.

(57) ABSTRACT

A semiconductor device includes a substrate having a main surface, a plurality of first wirings, each having a first embedded part embedded in the substrate and exposed from the main surface, and a mounted part which is in contact with the main surface and is connected to the first embedded part, a semiconductor element having an element rear surface and a plurality of electrodes bonded to the mounted parts, a plurality of second wirings, each having a second embedded part embedded in the substrate and exposed from the main surface and a columnar part protruding from the second embedded part in the thickness direction, and being located outward from the semiconductor element as viewed in the thickness direction; and a passive element located on the side facing the main surface in the thickness direction more than the semiconductor element, and electrically connected to the plurality of second wirings.

22 Claims, 24 Drawing Sheets

(51) Int. Cl.
  *H01L 23/31* (2006.01)
  *H01L 23/538* (2006.01)
  *H01L 21/48* (2006.01)
  *H01L 21/56* (2006.01)
  *H01L 49/02* (2006.01)

(52) U.S. Cl.
  CPC ........ *H01L 21/565* (2013.01); *H01L 23/3121* (2013.01); *H01L 23/5384* (2013.01); *H01L 23/5386* (2013.01); *H01L 23/5389* (2013.01); *H01L 24/13* (2013.01); *H01L 24/16* (2013.01); *H01L 28/10* (2013.01); *H01L 2224/13083* (2013.01); *H01L 2224/13111* (2013.01); *H01L 2224/13144* (2013.01); *H01L 2224/13155* (2013.01); *H01L 2224/13164* (2013.01); *H01L 2224/16227* (2013.01); *H01L 2924/19042* (2013.01); *H01L 2924/19104* (2013.01)

(58) Field of Classification Search
  CPC ............. H01L 23/5389; H01L 21/4853; H01L 21/486; H01L 21/565; H01L 23/49805; H01L 23/28–3192; H01L 21/56–568; H01L 2924/181–186; H01L 25/043; H01L 25/0657; H01L 25/074; H01L 23/522–53295; H01L 21/768–76898
  See application file for complete search history.

(56) References Cited

U.S. PATENT DOCUMENTS

| | | | |
|---|---|---|---|
| 2008/0251285 A1* | 10/2008 | Sato .................. | H05K 1/0231 361/313 |
| 2017/0133288 A1* | 5/2017 | Baek .................. | H01L 23/3128 |
| 2020/0135654 A1* | 4/2020 | Lee .................... | H01L 23/5383 |
| 2020/0144235 A1* | 5/2020 | Kang ................. | H01L 21/481 |
| 2020/0144236 A1* | 5/2020 | Jang .................. | H01L 23/552 |

\* cited by examiner

SEMICONDUCTOR DEVICE HAVING DISTINGUISHABLE ELECTRODES

CROSS-REFERENCE TO RELATED APPLICATION(S)

This application is based upon and claims the benefit of priority from Japanese Patent Application No. 2018-224608, filed on Nov. 30, 2018, the entire contents of which are incorporated herein by reference.

TECHNICAL FIELD

The present disclosure relates to a semiconductor device on which a semiconductor element and a passive element are mounted.

BACKGROUND

In the related art, an example of a semiconductor device, on which a semiconductor element and a passive element (chip component) are mounted, has been disclosed. These elements are mounted on a conductive pattern formed from a lead frame. The passive element is located outward of the semiconductor element as viewed in a thickness direction. The semiconductor element is electrically connected to a plurality of conductive patterns located further outward than the passive element as viewed in the thickness direction through a plurality of wires.

Therefore, the semiconductor device disclosed in in the related art increased the dimension viewed along the thickness direction, resulting in enlargement of the device. Consequently, measures for suppressing the enlargement of the semiconductor device are desired.

SUMMARY

Some embodiments of the present disclosure provide a semiconductor device capable of suppressing enlargement of the device even when a semiconductor element and a passive element are mounted.

According to one embodiment of the present disclosure, there is provided a semiconductor device that includes a substrate having a main surface and a rear surface facing opposite sides to each other in a thickness direction; a plurality of first wirings, each having a first embedded part embedded in the substrate and exposed from both the main surface and the rear surface, and a mounted part which is in contact with the main surface and is connected to the first embedded part; a semiconductor element having an element rear surface facing the main surface and a plurality of electrodes installed on the element rear surface, wherein the plurality of electrodes are bonded to the mounted part in each of the plurality of first wirings; a plurality of second wirings, each having a second embedded part embedded in the substrate and exposed from both the main surface and the rear surface, and a columnar part protruding from the second embedded part to a side which the main surface faces in the thickness direction, wherein the plurality of second wirings is located outward from the semiconductor element as viewed in the thickness direction; and a passive element located on a side facing the main surface in the thickness direction rather than the semiconductor element, and electrically connected to the plurality of second wirings, wherein a portion of the passive element is configured to overlap the semiconductor element as viewed in the thickness direction, and wherein the passive element is supported by the columnar part in each of the plurality of second wirings.

In the embodiment of the present disclosure, desirably, the passive element is an inductor.

In the embodiment of the present disclosure, desirably, the substrate is made of an intrinsic semiconductor material.

In the embodiment of the present disclosure, desirably, the plurality of second wirings are located on both sides of a first direction orthogonal to the thickness direction of the semiconductor element.

In the embodiment of the present disclosure, desirably, the plurality of second wirings is arranged in a second direction orthogonal to both the thickness direction and the first direction.

Desirably, the embodiment of the present disclosure further includes a first sealing resin having an outer surface facing the same side as the main surface in the thickness direction and covering a portion of each of the substrate, the plurality of first wirings, the semiconductor element, and the plurality of second wirings, wherein the columnar part has a top surface facing the same side as the main surface in the thickness direction and the top surface is flush with the outer surface.

Desirably, the embodiment of the present disclosure further includes a pair of rewirings which is separated from each other in the first direction and are in contact with the outer surface and the top surface, wherein the passive element is bonded to the pair of rewirings.

In the embodiment of the present disclosure, desirably, the semiconductor element has an element surface facing an opposite side to the element rear surface, wherein the element surface is flush with the outer surface.

Desirably, the embodiment of the present disclosure further includes a second sealing resin covering the passive element, wherein the second sealing resin is in contact with the outer surface.

In the embodiment of the present disclosure, desirably, a portion of the second sealing resin is interposed between the semiconductor element and the passive element.

In the embodiment of the present disclosure, desirably, the substrate has a plurality of end surfaces connected to both the main surface and the rear surface and facing a direction orthogonal to the thickness direction as viewed in the thickness direction, wherein the plurality of end surfaces is located outward from the second sealing resin.

In the embodiment of the present disclosure, desirably, the first sealing resin has a plurality of side surfaces connected to the outer surface and facing a direction orthogonal to the thickness direction, wherein the plurality of side surfaces are flush with the plurality of end surfaces.

In the embodiment of the present disclosure, desirably, each of the plurality of first embedded parts has a first bottom surface facing the same side as the rear surface in the thickness direction and each of the plurality of second embedded parts has a second bottom surface facing the same side as the rear surface in the thickness direction, wherein the first bottom surface and the second bottom surface are flush with the rear surface.

Desirably, the embodiment of the present disclosure further includes a protective film configured to cover the rear surface.

Desirably, the embodiment of the present disclosure further includes a plurality of terminals which is individually in contact with the first bottom surface and the second bottom surface.

In the embodiment of the present disclosure, desirably, each of the plurality of terminals includes a base part which is in contact with either the first bottom surface or the second bottom surface, and a bump part protruding from the base part to a side which the rear surface faces in the thickness direction, wherein the base part contains gold and the bump part contains tin.

Other features and advantages of the present disclosure will become more apparent from the detailed description below given with reference to the accompanying drawings.

DETAILED DESCRIPTION

Modes for carrying out the present disclosure (hereinafter, referred to as "embodiments") will be described with reference to the drawings.

First Embodiment

Figure 2:
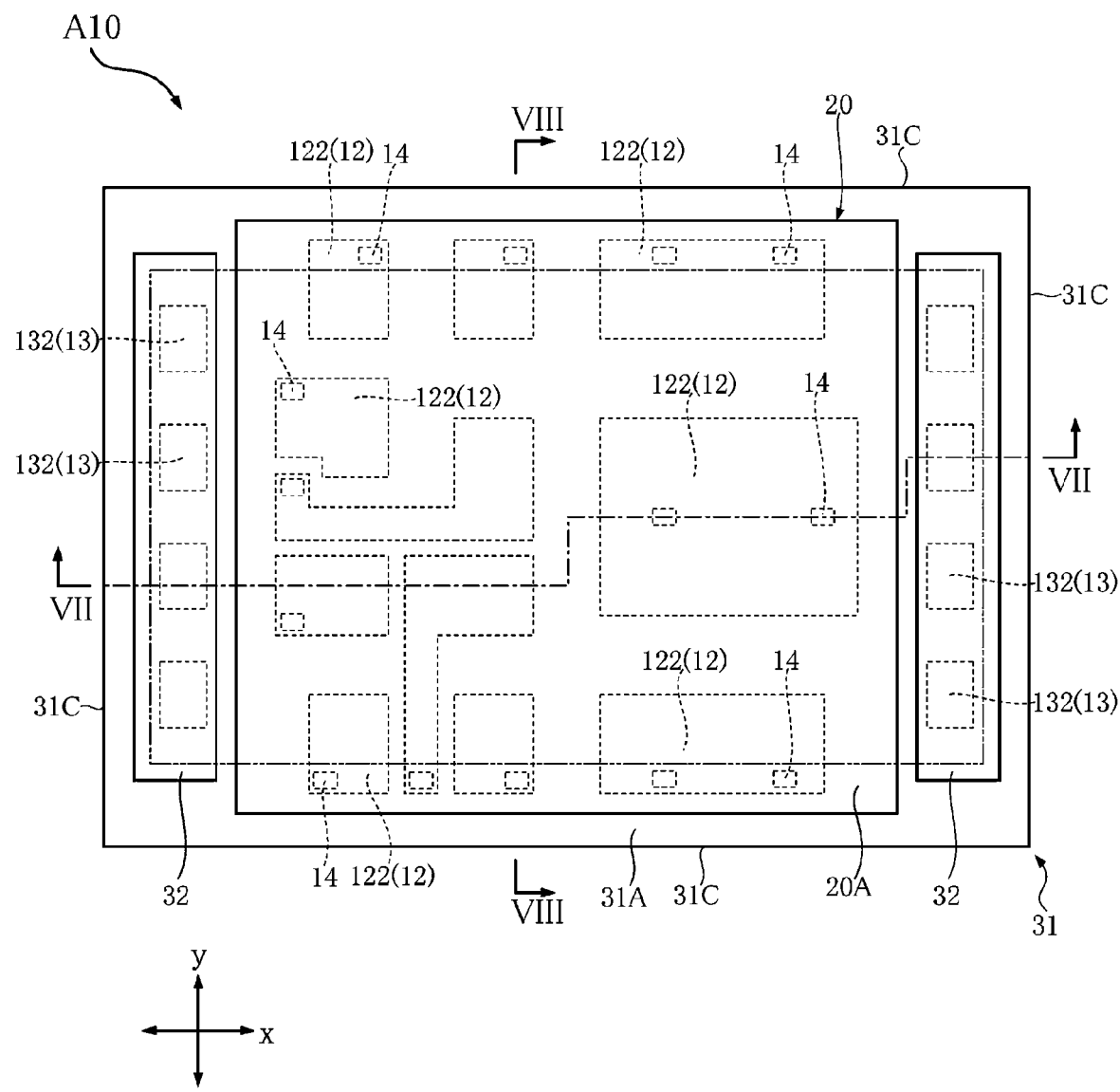
FIG. 2 is a plan view through which a pair of second bonding layers and a passive element is transmitted with respect to FIG. 1.
Figure 3:
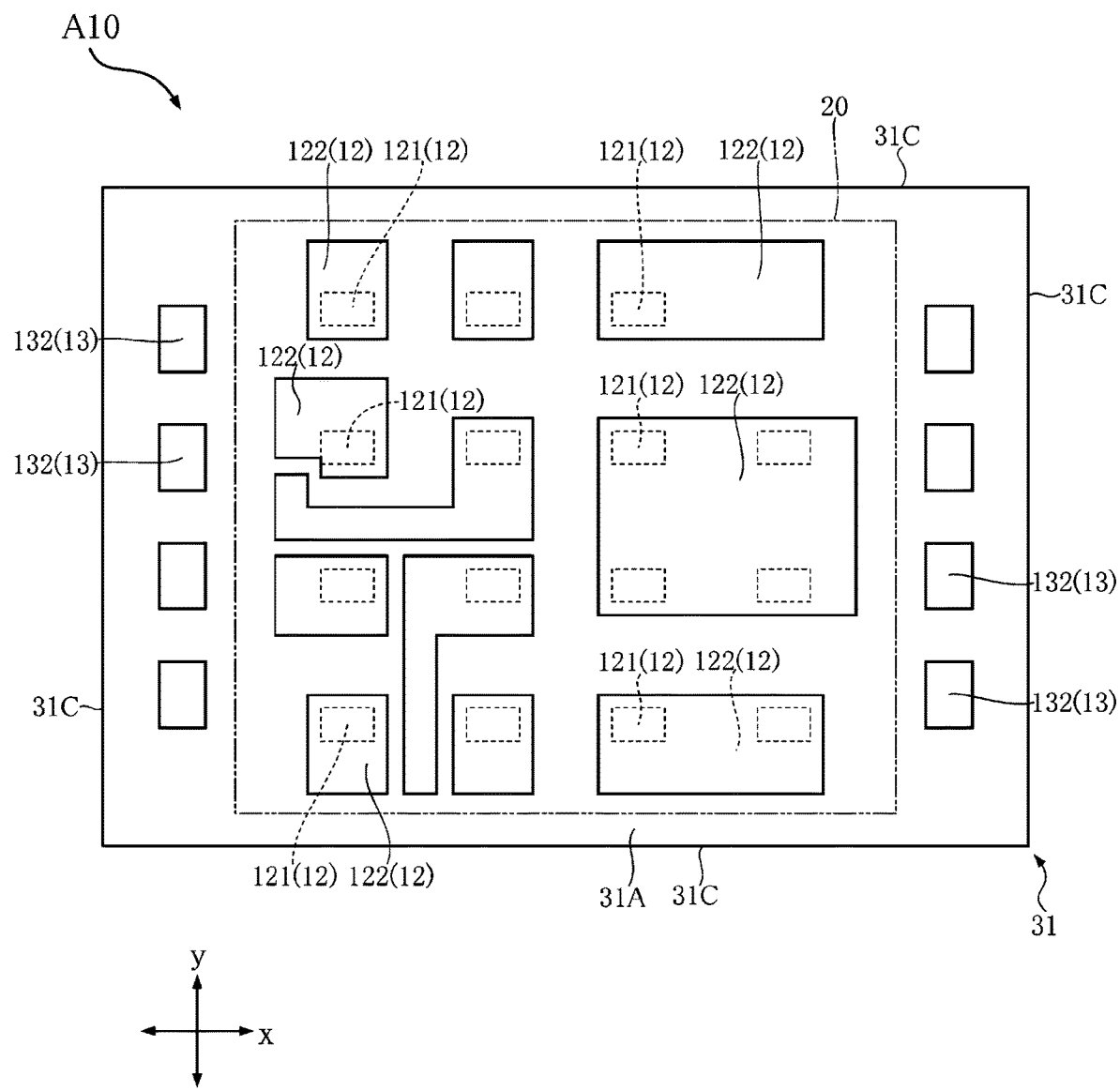
FIG. 3 is a plan view through which a semiconductor element, a first sealing resin, and a pair of rewirings are transmitted with respect to FIG. 2.

A semiconductor device A10 according to a first embodiment of the present disclosure will be described with reference to FIGS. 1 to 10. The semiconductor device A10 includes a substrate 11, a plurality of first wirings 12, a plurality of second wirings 13, and a passive element 41. In addition, the semiconductor device A10 further includes a plurality of first bonding layers 14, a protective film 15, a plurality of terminals 16, a first sealing resin 31, a pair of rewirings 32, a pair of second bonding layers 33, and a second sealing resin 42. The semiconductor device A10 illustrated in these drawings is of a resin package type that is surface-mounted on a wiring board of various electronic devices. In an example illustrated by the semiconductor device A10, the semiconductor device A10 constitutes a circuit of a DC/DC converter together with a resistor and a capacitor. Here, in FIG. 1, the second sealing resin 42 is transmitted and the transmitted second sealing resin 42 is illustrated by an imaginary line (two-dot chain line) for convenience of understanding. In FIG. 2, the pair of second bonding layers 33 and the passive element 41 are transmitted with respect to FIG. 1 for convenience of understanding. In FIG. 3, the semiconductor element 20 is illustrated by transmitting the semiconductor element 20, the first sealing resin 31, and the pair of rewirings 32 by imaginary lines for convenience of understanding.

Figure 1:
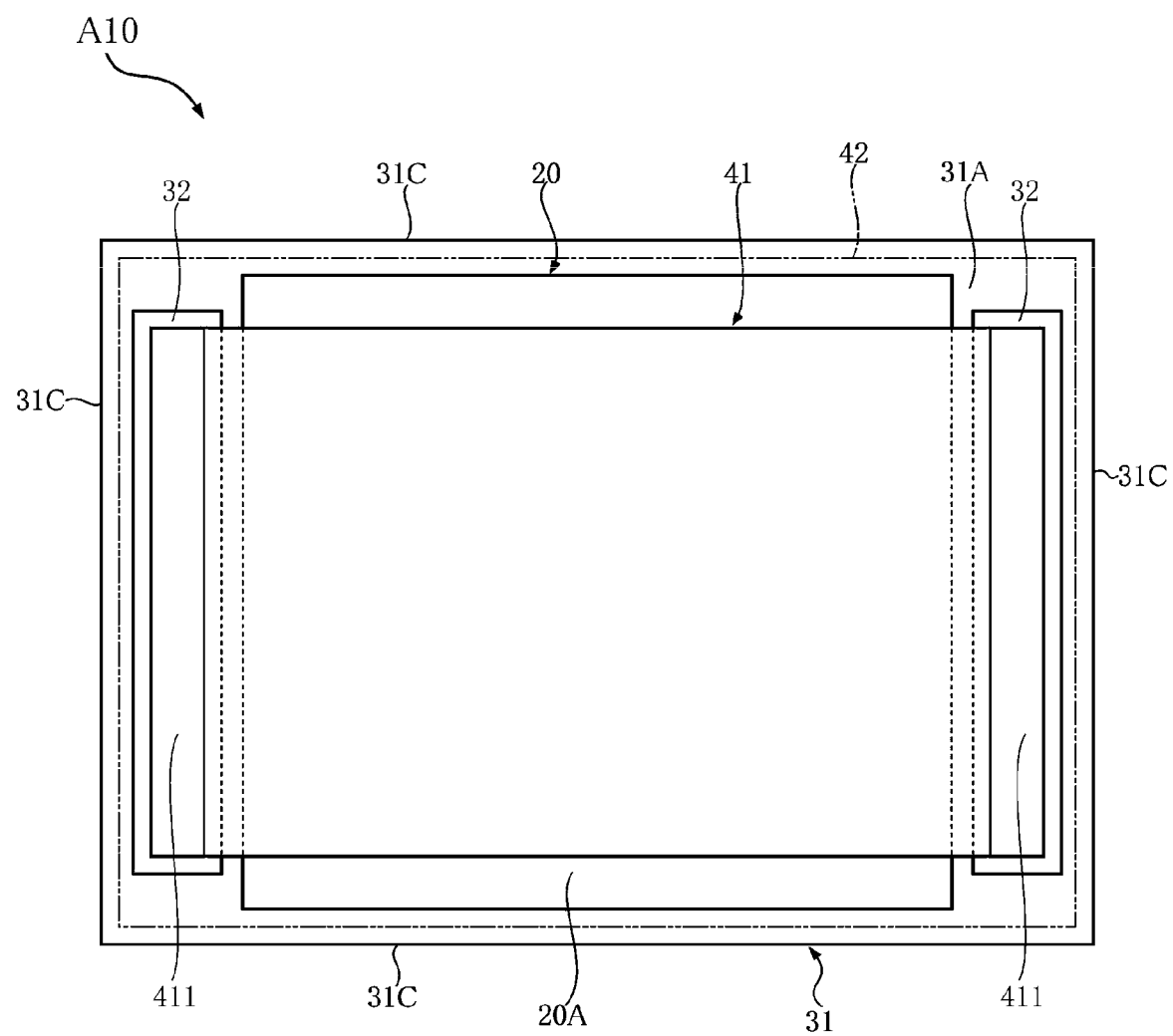
FIG. 1 is a plan view (transmission of a second sealing resin) of a semiconductor device according to a first embodiment of the present disclosure.
Figure 1:
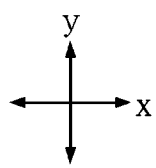

In the description of the semiconductor device A10, a thickness direction of the substrate 11 will be referred to as a "thickness direction z." A direction orthogonal to the thickness direction z will be referred to as a "first direction x." A direction orthogonal to both the thickness direction z and the first direction x will be referred to as a "second direction y." As illustrated in FIG. 1, the semiconductor device A10 has a rectangular shape as viewed in the thickness direction z. The first direction x corresponds to a longitudinal direction of the semiconductor device A10. The second direction y corresponds to a transverse direction of the semiconductor device A10.

Figure 7:
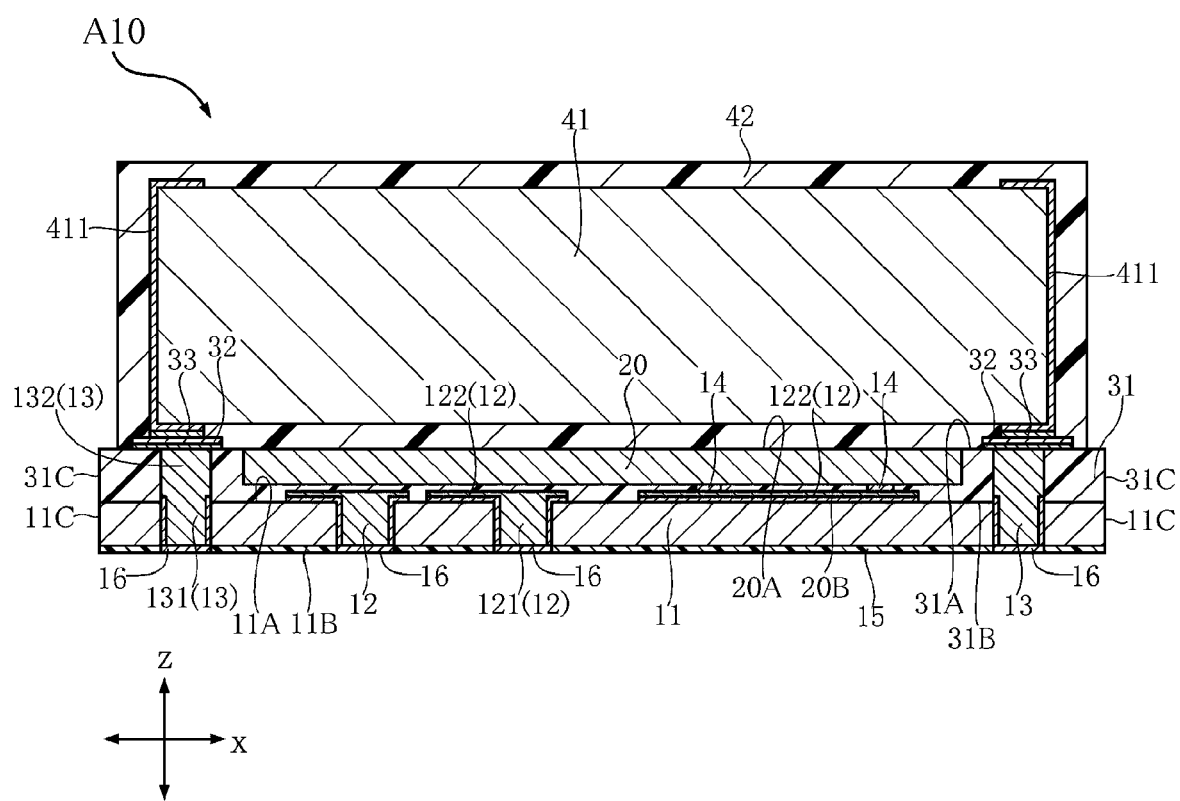
FIG. 7 is a cross-sectional view taken along line VII-VII in FIG. 2.
Figure 8:
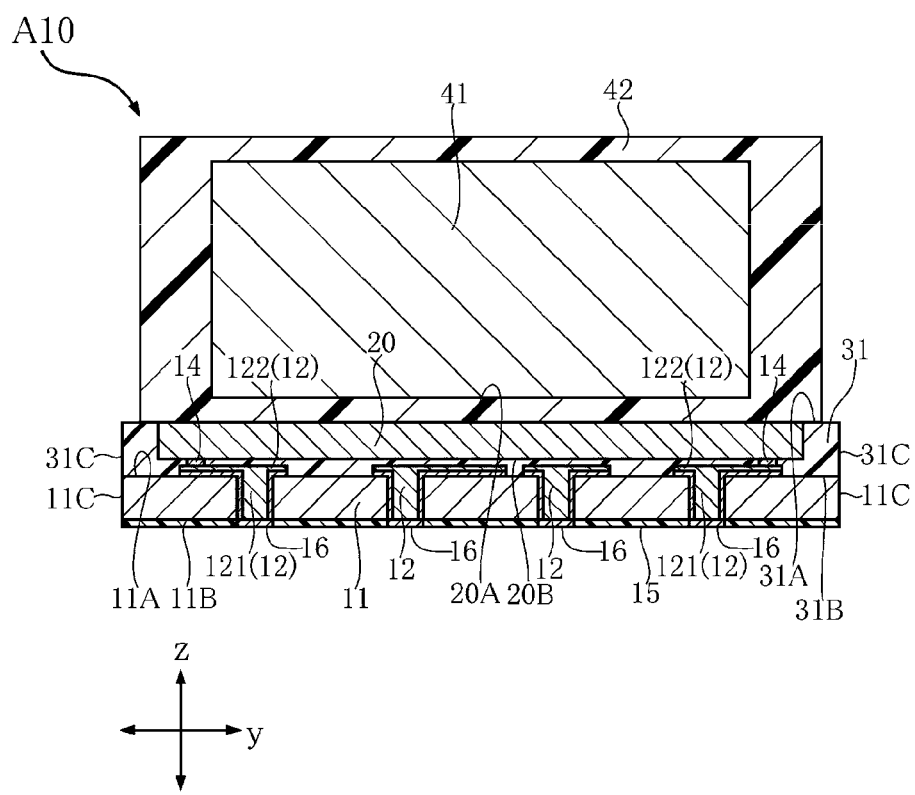
FIG. 8 is a cross-sectional view taken along line VIII-VIII in FIG. 2.

As illustrated in FIGS. 7 and 8, a plurality of first wirings 12, a plurality of second wirings 13, and a protective film 15 are mounted on the substrate 11. The semiconductor element 20 is supported on the substrate 11 via the plurality of first wirings 12 and the plurality of first bonding layers 14. The substrate 11 is made of an intrinsic semiconductor material. In the example illustrated by the semiconductor device A10, the intrinsic semiconductor material is silicon (Si). The substrate 11 has a main surface 11A, a rear surface 11B, and a plurality of end surfaces 11C. The main surface 11A and the rear surface 11B face opposite sides to each other in the thickness direction z. Among these, the main surface 11A faces the semiconductor element 20. Each of the plurality of end surfaces 11C is connected to both the main surface 11A and the rear surface 11B, and faces either of the first direction x and the second direction y. The plurality of end surfaces 11C are exposed from the first sealing resin 31.

Figure 10:
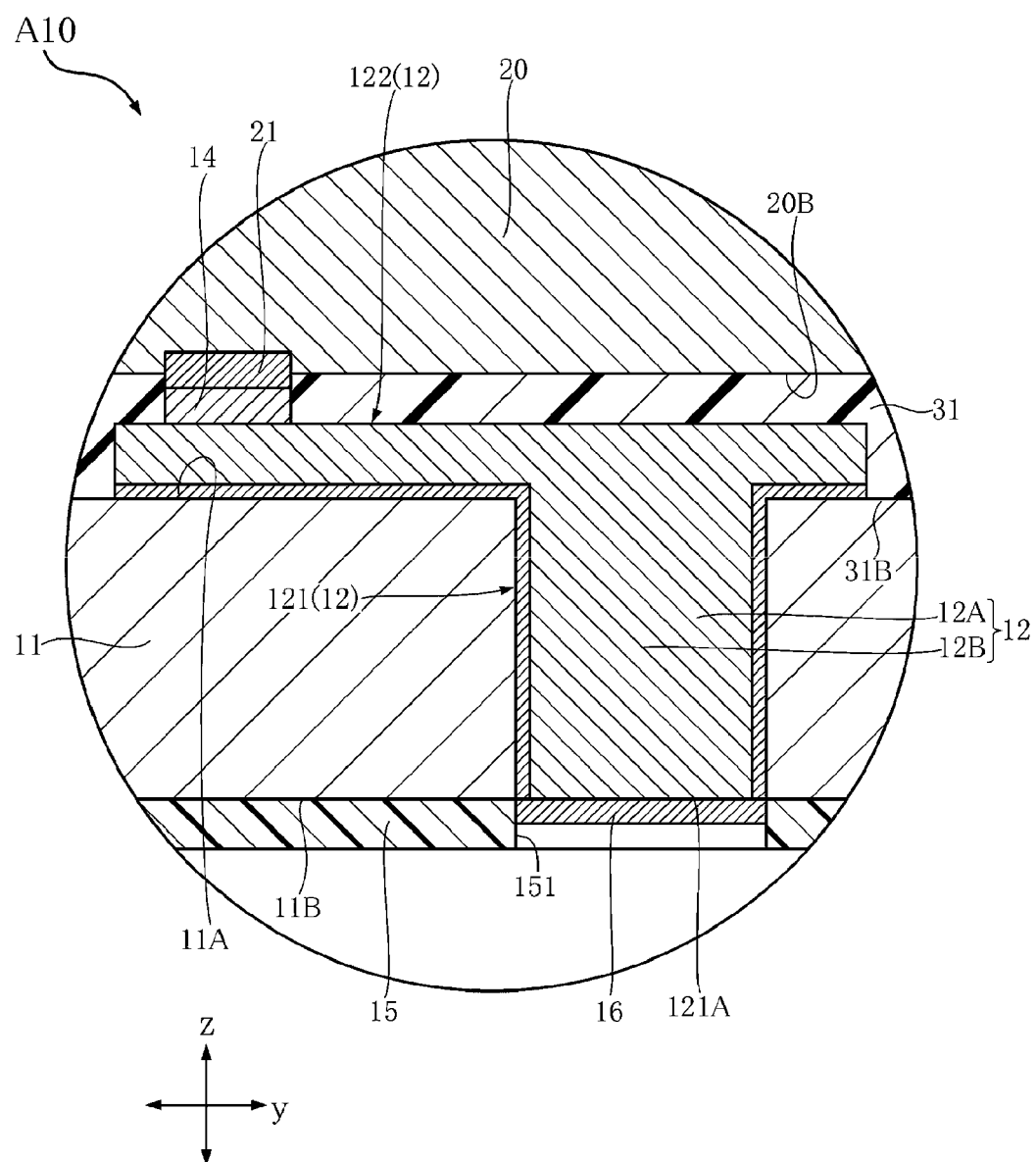
FIG. 10 is a partial enlarged view of FIG. 8.

The plurality of first wirings 12 are arranged on the substrate 11 as illustrated in FIGS. 3, 7 and 8. The plurality of first wirings 12 forms a conductive path for supplying power to the semiconductor element 20 and for inputting and outputting signals. Each of the plurality of first wirings 12 has a first embedded part 121 and a mounted part 122. The first embedded part 121 is embedded in the substrate 11. The first embedded part 121 is exposed from both the main surface 11A and the rear surface 11B of the substrate 11. As illustrated in FIG. 10, the first embedded part 121 has a first bottom surface 121A. The first bottom surface 121A faces the same side as the rear surface 11B in the thickness direction z and is exposed from the rear surface 11B. The mounted part 122 is in contact with the main surface 11A. The mounted part 122 is connected to the first embedded part 121.

As illustrated in FIG. 10, each of the plurality of first wirings 12 includes an underlying layer 12A and a plating layer 12B. The underlying layer 12A is a metal thin film including a barrier layer and a seed layer stacked on the barrier layer. The barrier layer is made of, for example, titanium (Ti). The seed layer is made of, for example, copper (Cu). The plating layer 12B is made of, for example, copper. In the first embedded part 121 of the first wiring 12, the underlying layer 12A is formed on a peripheral edge of the first embedded part 121 as viewed in the thickness direction z and is in contact with the substrate 11. The plating layer 12B is surrounded by the underlying layer 12A. In the mounted part 122 of the first wiring 12, the underlying layer 12A is in contact with the main surface 11A of the substrate 11. The plating layer 12B is stacked on the underlying layer 12A.

Figure 9:
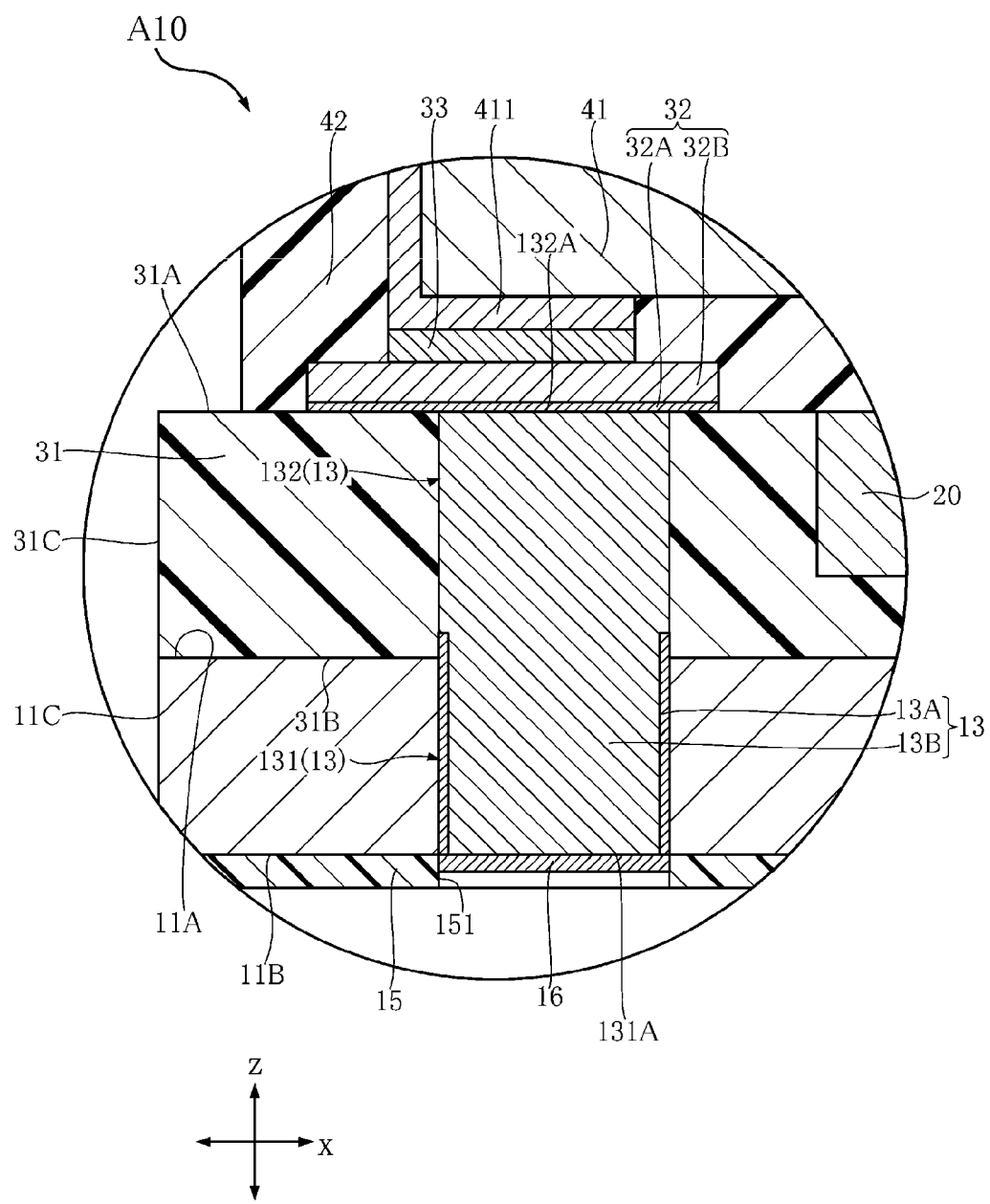
FIG. 9 is a partial enlarged view of FIG. 7.

The plurality of second wirings 13 is arranged on the substrate 11 as illustrated in FIGS. 3, 7, and 8. The plurality of second wirings 13 forms a conductive path for supplying power to the passive element 41. As illustrated in FIGS. 2 and 3, the plurality of second wirings 13 is located outward from the semiconductor element 20 as viewed in the thickness direction z. The plurality of second wirings 13 is located on both sides of the semiconductor element 20 in the first direction x. In the example illustrated by the semiconductor device A10, in the plurality of second wirings 13, four second wirings 13 are located on one side in the first direction x and four second wirings 13 are located on the other side in the first direction x. The plurality of second wirings 13 is arranged along the second direction y. Each of the plurality of second wirings 13 has a second embedded part 131 and a columnar part 132. The second embedded part 131 is embedded in the substrate 11. The second embedded part 131 is exposed from both the main surface 11A and the rear surface 11B of the substrate 11. As illustrated in FIG. 9, the second embedded part 131 has a second bottom surface 131A. The second bottom surface 131A faces the same side as the rear surface 11B in the thickness direction z and is exposed from the rear surface 11B. The columnar part 132 protrudes from the second embedded part 131 to a side which the main surface 11A faces in the thickness direction z. The columnar part 132 has a top surface 132A. The top surface 132A is exposed from the first sealing resin 31.

As illustrated in FIG. 9, each of the plurality of second wirings 13 includes an underlying layer 13A and a plating layer 13B. The underlying layer 13A is a metal thin film including a barrier layer and a seed layer stacked on the barrier layer. The barrier layer is made of, for example, titanium. The seed layer is made of, for example, copper. The plating layer 13B is made of, for example, copper. In the second embedded part 131 of the second wiring 13, the underlying layer 13A is formed on a peripheral edge of the second embedded part 131 as viewed in the thickness direction z and is in contact with the substrate 11. The plating layer 13B is surrounded by the underlying layer 13A. In the columnar part 132 of the second wiring 13, the underlying layer 13A is formed on a peripheral edge of the end portion of the columnar part 132 connected to the second embedded part 131 as viewed in the thickness direction z. The plating layer 13B is formed in a region surrounded by the underlying layer 13A and a region located above the region surrounded by the underlying layer 13A.

The plurality of first bonding layers 14 are arranged on the mounted parts 122 of the plurality of first wirings 12 as illustrated in FIGS. 7, 8, and 10. The first bonding layers 14 are each, for example, an alloy containing tin (Sn) and silver (Ag). A plurality of electrodes 21 (which will be described later) of the semiconductor element 20 is bonded to the plurality of mounted parts 122 by the plurality of first bonding layers 14. Accordingly, the semiconductor element 20 is electrically connected to the plurality of first wirings 12.

Figure 4:
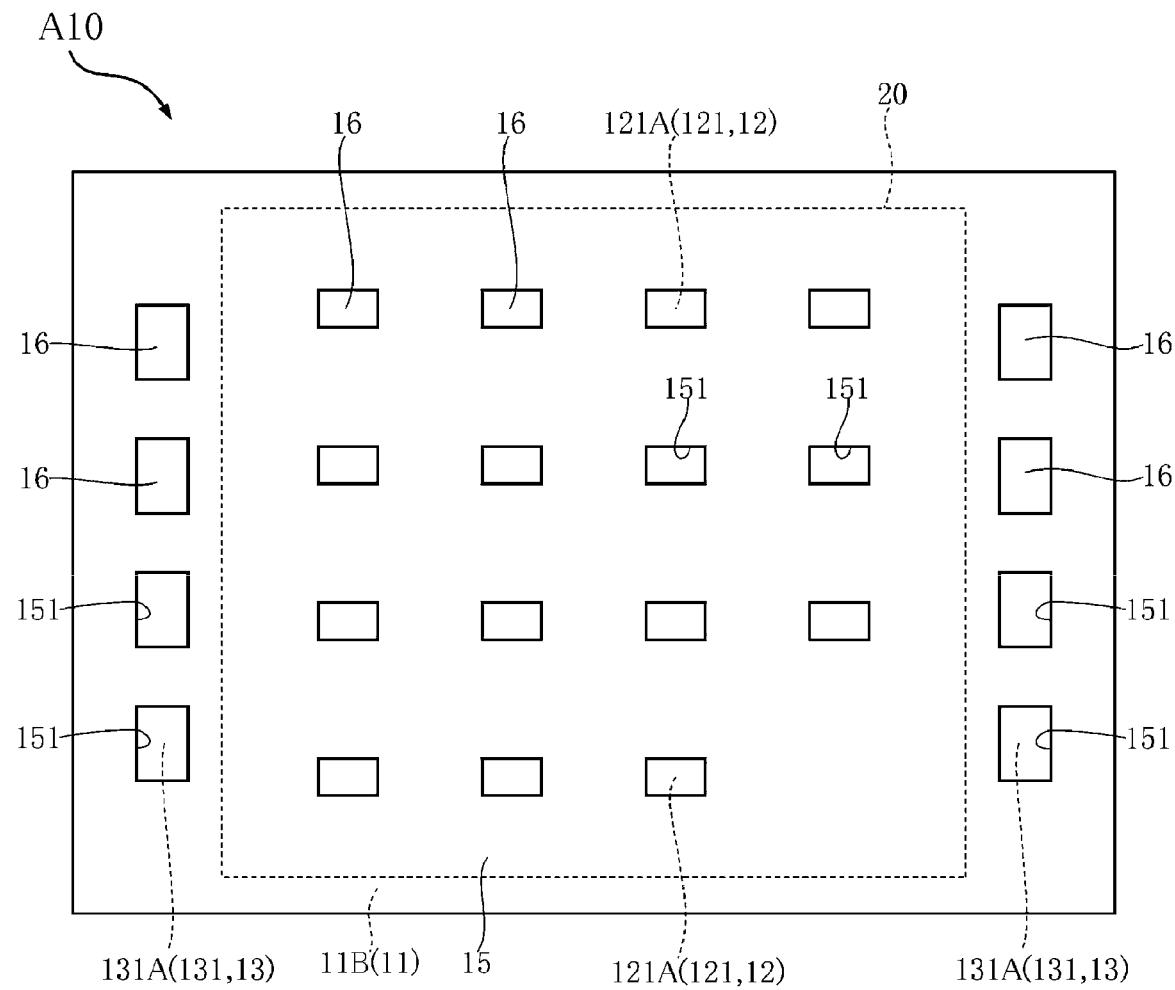
FIG. 4 is a bottom view of the semiconductor device illustrated in FIG. 1.
Figure 5:
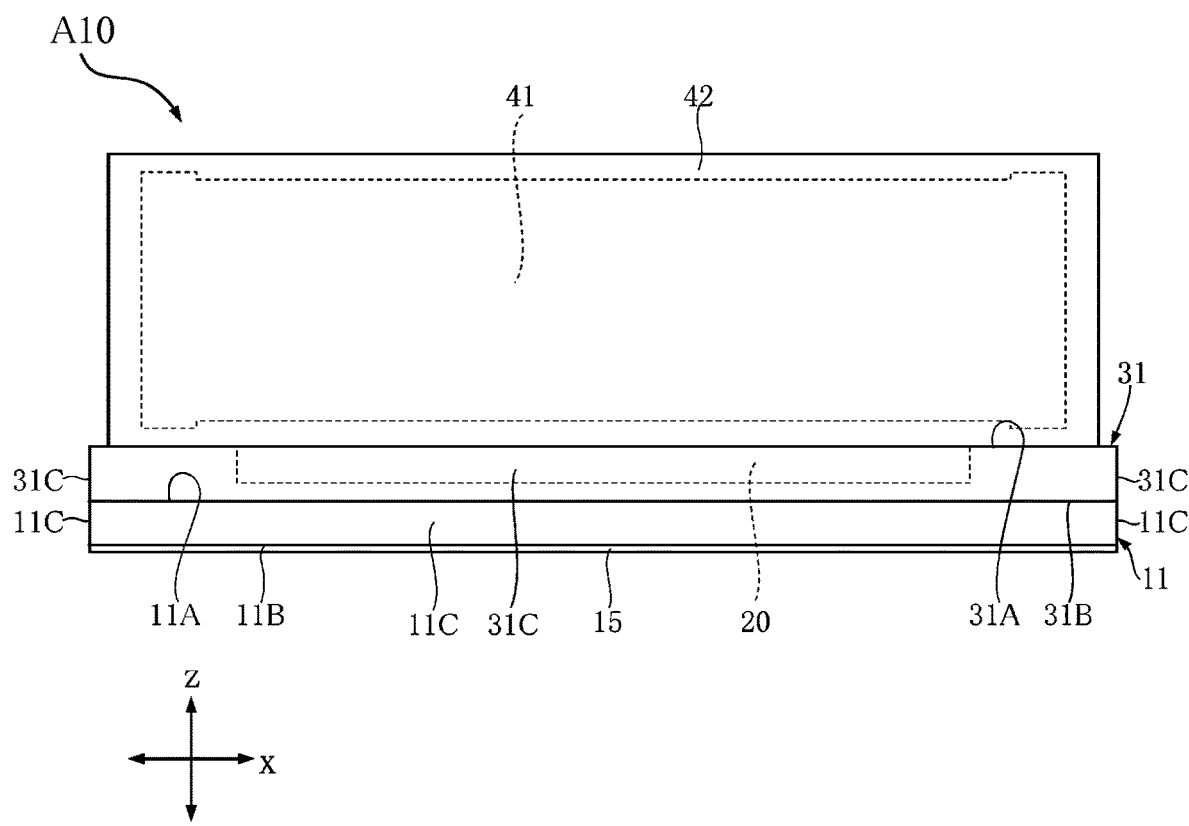
FIG. 5 is a front view of the semiconductor device illustrated in FIG. 1.
Figure 6:
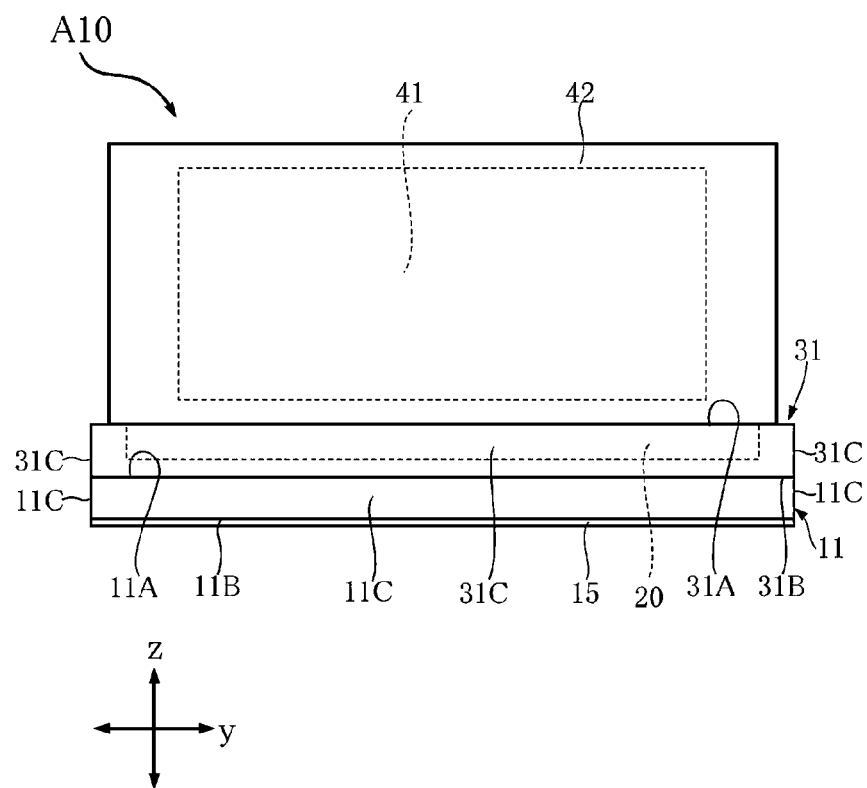
FIG. 6 is a right side view of the semiconductor device illustrated in FIG. 1.

The protective film 15 is configured to cover the rear surface 11B of the substrate 11 as illustrated in FIGS. 4, 7 and 8. The protective film 15 has an electrical insulation property. The protective film 15 is made of, for example, an insulating material containing polyimide. As illustrated in FIGS. 9 and 10, the protective film 15 has a plurality of openings 151. The plurality of openings 151 penetrates the protective film 15 in the thickness direction z. As illustrated in FIG. 4, the plurality of openings 151 overlaps the first bottom surfaces 121A of the plurality of first embedded parts 121 (first wirings 12) and the second bottom surfaces 131A of the plurality of second embedded parts 131 (second wirings 13) as viewed in the thickness direction z.

As illustrated in FIGS. 4, 9, and 10, the plurality of terminals 16 are individually in contact with the first bottom surfaces 121A of the plurality of first embedded parts 121 (first wirings 12) and the second bottom surface 131A of the plurality of second embedded parts 131 (second wirings 13). The plurality of terminals 16 is used for mounting the semiconductor device A10 on the wiring board. In the semiconductor device A10, the plurality of terminals 16 are accommodated in the plurality of openings 151 of the protective film 15. In the semiconductor device A10, each of the terminals 16 is made of a metal layer. In the example illustrated by the semiconductor device A10, the terminal 16 is formed of a nickel (Ni) layer which is in contact with either the first bottom surface 121A or the second bottom surface 131A, a palladium (Pd) layer stacked on the nickel layer, and a gold (Au) layer stacked on the palladium layer. The terminal 16 may also be formed by directly stacking the gold layer on the nickel layer without having the palladium layer.

The semiconductor element 20 is bonded to the mounted parts 122 of the plurality of first wirings 12 as illustrated in FIGS. 7 and 8. In the example illustrated by the semiconductor device A10, the semiconductor element 20 is an LSI including a switching circuit, a gate driver for driving the switching circuit, various detection circuits for detecting current flowing through the switching circuit and a temperature thereof, and the like. The switching circuit includes, for example, a metal-oxide-semiconductor field-effect transistor (MOSFET) and a free-wheeling diode.

The semiconductor element 20 has an element surface 20A, an element rear surface 20B, and a plurality of electrodes 21 as illustrated in FIGS. 7, 8, and 10. The element surface 20A faces the opposite side of the element rear surface 20B. The element surface 20A is exposed from the first sealing resin 31. The element rear surface 20B faces the main surface 11A of the substrate 11. The plurality of electrodes 21 are installed on the element rear surface 20B. The plurality of electrodes 21 are electrically connected to a switching circuit or the like configured in the semiconductor element 20. Each of the electrodes 21 is made of, for example, a conductive material containing aluminum (Al).

The first sealing resin 31 covers a portion of each of the substrate 11, the plurality of first wirings 12, the plurality of second wirings 13, and the semiconductor element 20 as illustrated in FIGS. 7 and 8. The first sealing resin 31 has an electrical insulation property. The first sealing resin 31 is made of, for example, an insulating material containing a black epoxy resin. The first sealing resin 31 has an outer surface 31A, an inner surface 31B, and a plurality of side surfaces 31C.

As illustrated in FIGS. 5 to 8, the outer surface 31A faces the same side as the main surface 11A of the substrate 11 in the thickness direction z. The outer surface 31A faces the passive element 41. The top surfaces 132A of the plurality of columnar parts 132 (second wirings 13) and the element surface 20A of the semiconductor element 20 are flush with the outer surface 31A. The inner surface 31B faces the opposite side of the outer surface 31A. The inner surface 31B is in contact with the main surface 11A. Each of the plurality of side surfaces 31C is connected to both the outer surface 31A and the inner surface 31B, and faces either the first direction x or the second direction y. As illustrated in FIG. 1, the plurality of side surfaces 31C are located outward from the second sealing resin 42 as viewed in the thickness direction z. The end surfaces 11C of the substrate 11 are flush with the side surfaces 31C.

The pair of rewirings 32 is arranged on the first sealing resin 31 as illustrated in FIGS. 2 and 7. The pair of rewirings 32 forms a conductive path for supplying power to the passive element 41 together with the plurality of second wirings 13. The pair of rewirings 32 is separated from each other in the first direction x. The pair of rewirings 32 is in contact with both the top surfaces 132A of the plurality of columnar parts 132 (second wirings 13) and the outer surface 31A of the first sealing resin 31. The pair of rewirings 32 has a band shape extending in the second direction y.

As illustrated in FIG. 9, each of the pair of rewirings 32 includes an underlying layer 32A and a plating layer 32B. The underlying layer 32A is in contact with both the plurality of top surfaces 132A and the outer surface 31A. The underlying layer 32A is a metal thin film including a barrier layer and a seed layer stacked on the barrier layer. The barrier layer is made of, for example, titanium. The seed layer is made of, for example, copper. The plating layer 32B is stacked on the underlying layer 32A. The plating layer 32B is made of, for example, copper.

The pair of second bonding layers 33 is arranged on the pair of rewirings 32 as illustrated in FIGS. 7 and 9. Each of the second bonding layers 33 is, for example, lead-free solder. A pair of electrodes 411 (which will be described later) of the passive element 41 is bonded to the pair of rewirings 32 by the pair of second bonding layers 33. Accordingly, the passive element 41 is supported by the columnar parts 132 of the plurality of second wirings 13 through the pair of rewirings 32 and is electrically connected to the plurality of second wirings 13.

The passive element 41 is bonded to the pair of rewirings 32 as illustrated in FIGS. 7 and 9. The passive element 41 is located on a side facing the main surface 11A of the substrate 11 in the thickness direction z rather than the semiconductor element 20. As illustrated in FIGS. 1 and 2, at least a portion of the passive element 41 overlaps the semiconductor element 20 as viewed in the thickness direction z. In the semiconductor device A10, the passive element 41 straddles the semiconductor element 20. The passive element 41 is supported by the columnar parts 132 of the plurality of second wirings 13 through the pair of rewirings 32. The passive element 41 is an inductor. The passive element 41 is not limited to an inductor, but may be, for example, a capacitor. The passive element 41 has the pair of electrodes 411. The pair of electrodes 411 are separated from each other in the first direction x.

The second sealing resin 42 covers the pair of rewirings 32 and the passive elements 41 as illustrated in FIGS. 7 and 8. The second sealing resin 42 is in contact with the outer surface 31A of the first sealing resin 31. A portion of the second sealing resin 42 is interposed between the semiconductor element 20 and the passive element 41. In the semiconductor device A10, the corresponding interposed portion is in contact with both the element surface 20A of the semiconductor element 20 and the passive element 41. The second sealing resin 42 has an electrical insulation property. The second sealing resin 42 is made of, for example, an insulating material containing an epoxy resin.

Next, an example of a method of manufacturing the semiconductor device A10 will be described with reference to FIGS. 11 to 27. The positions of cross sections in FIGS. 11 to 27 are identical to the position of the cross section in FIG. 7.

Figure 11:
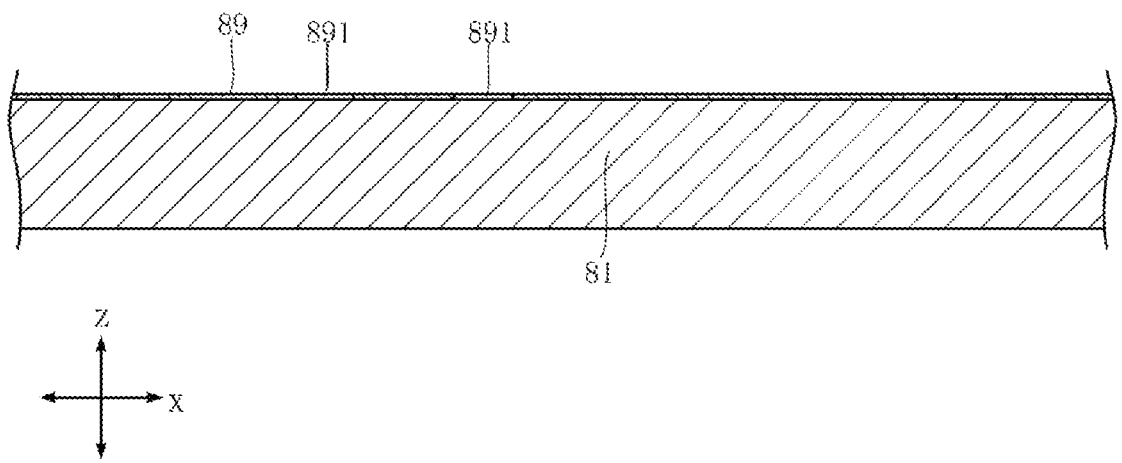
FIG. 11 is a cross-sectional view illustrating a manufacturing process of the semiconductor device illustrated in FIG. 1.

First, as illustrated in FIG. 11, a mask layer 89 is formed on one surface of a base material 81, which faces the thickness direction z. The mask layer 89 has a plurality of openings 891 penetrating in the thickness direction z. The base material 81 is a silicon wafer. The mask layer 89 includes an oxide film ($SiO_2$) having a thickness of 0.5 to 1.0 μm. First, an oxide film is formed on both surfaces of the base material 81, which face the thickness direction, by a thermal oxidation method. Next, the formed oxide film is partially removed by lithography patterning and reactive ion etching (RIE). The portions removed in this step become the plurality of openings 891. Finally, the resist used in the lithography patterning is removed. Thus, the mask layer 89 having the plurality of openings 891 is formed.

Figure 12:
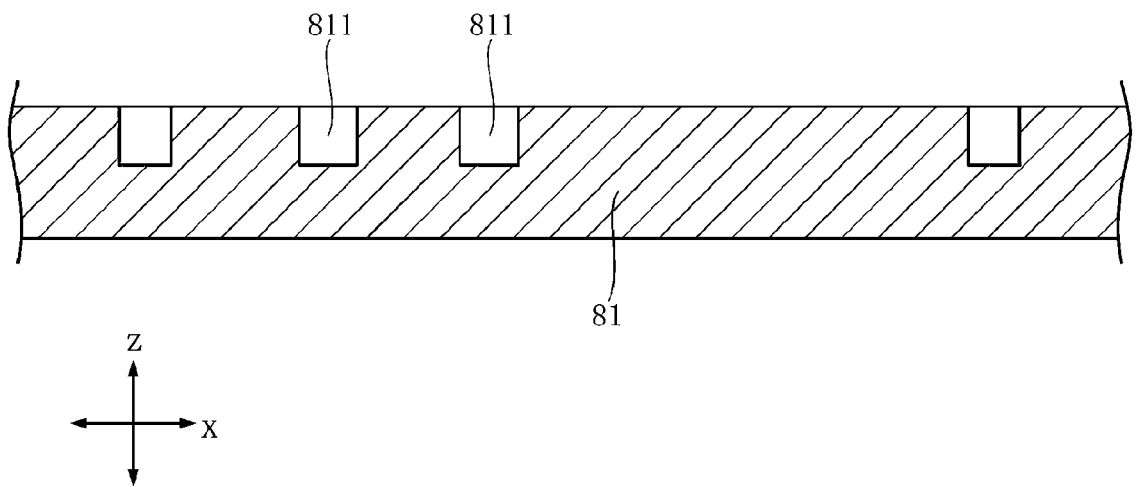
FIG. 12 is a cross-sectional view illustrating a manufacturing process of the semiconductor device illustrated in FIG. 1.

Next, as illustrated in FIG. 12, a plurality of holes 811 are formed in the base material 81, and the mask layer 89 is all removed. The plurality of holes 811 are recessed from one side of the base material 81 that faces the thickness direction z. First, the plurality of holes 811 are formed by deep reactive ion etching (RIE) or wet etching using a potassium hydroxide (KOH) aqueous solution. A Bosch process may be used as the deep RIE. Finally, the mask layer 89 is removed. The mask layer 89 is removed by wet etching using hydrofluoric acid (HF).

Figure 13:
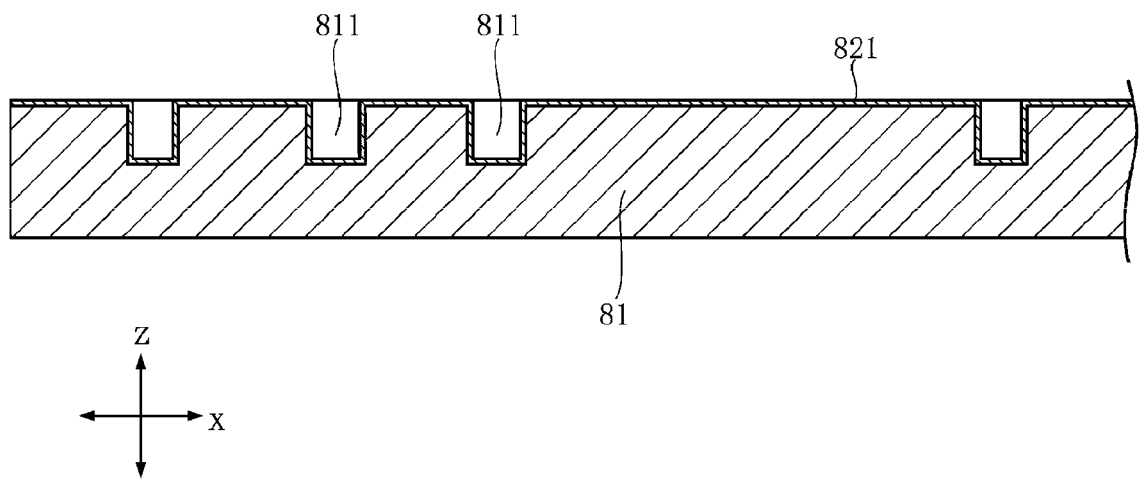
FIG. 13 is a cross-sectional view illustrating a manufacturing process of the semiconductor device illustrated in FIG. 1.

Next, as illustrated in FIG. 13, an oxide film (not shown) is formed by a thermal oxidation method so as to cover one surface of the base material 81 facing the thickness direction z and the surface of the base material 81 in contact with the plurality of holes 811. The thickness of the oxide film is 1.0 to 2.0 μm. Subsequently, a first underlying layer 821 covering the oxide film is formed. The first underlying layer 821 is formed by forming a barrier layer covering the base material 81 by a sputtering method and then stacking a seed layer on the barrier layer by the sputtering method. The barrier layer is made of titanium having a thickness of 100 to 300 nm. The seed layer is made of copper having a thickness of 200 to 600 nm.

Figure 14:
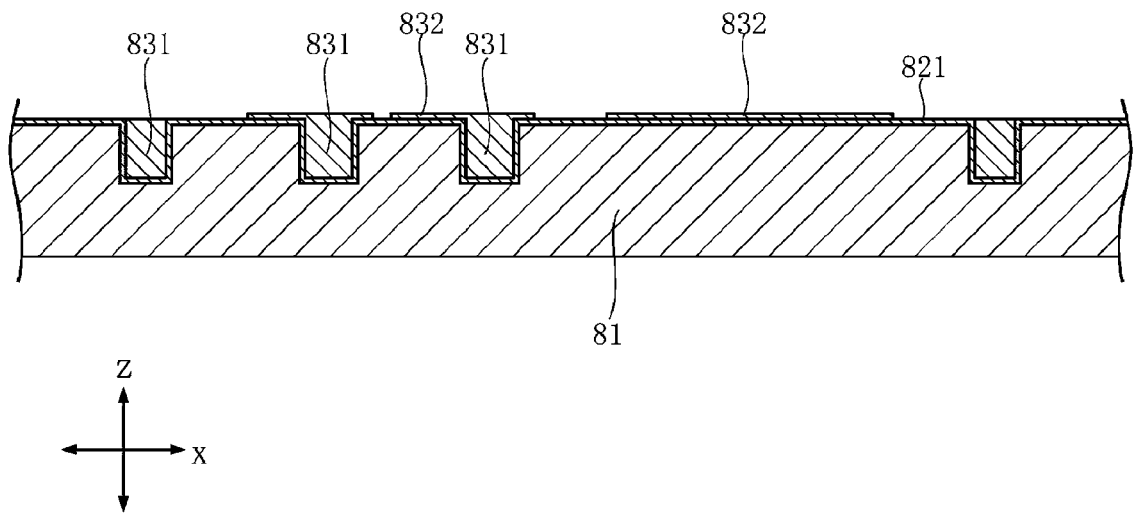
FIG. 14 is a cross-sectional view illustrating a manufacturing process of the semiconductor device illustrated in FIG. 1.

Next, as illustrated in FIG. 14, a plurality of first wiring layers 831 filling the plurality of holes 811 of the base material 81 is formed. At the same time, a plurality of second wiring layers 832 connected to some of the plurality of first wiring layers 831 is formed. The plurality of first wiring layers 831 and the plurality of second wiring layers 832 are formed by electrolytic plating using the first underlying layer 821 as a conductive path. The plurality of first wiring layers 831 is made of copper. The plurality of second wiring layers 832 is made of copper having a thickness of 10 to 30 μm.

Figure 15:
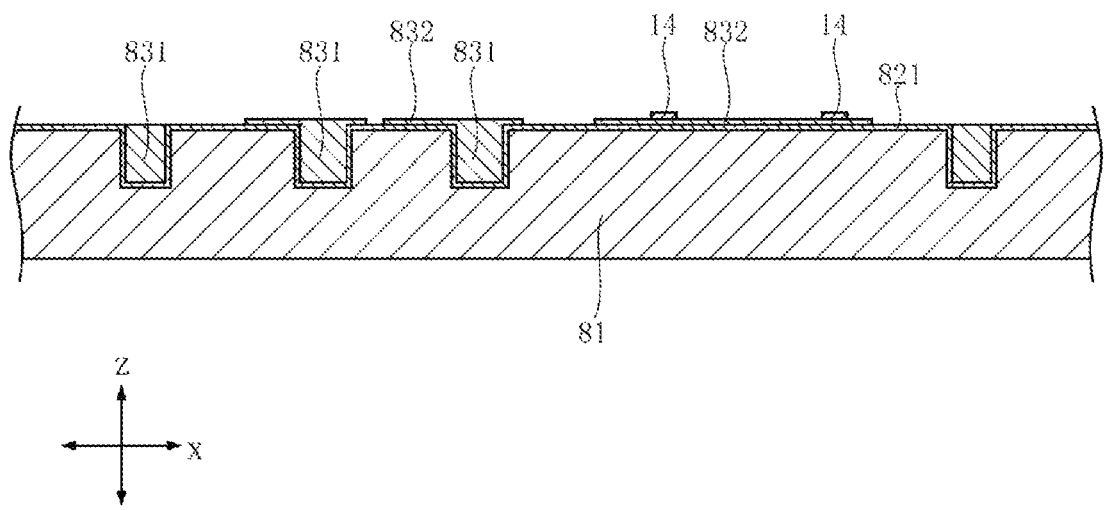
FIG. 15 is a cross-sectional view illustrating a manufacturing process of the semiconductor device illustrated in FIG. 1.

Next, as illustrated in FIG. 15, a plurality of first bonding layers 14 is formed on the plurality of second wiring layers 832. The plurality of first bonding layers 14 is formed by electrolytic plating using the first underlying layer 821 and the plurality of second wiring layers 832 as conductive paths.

Figure 16:
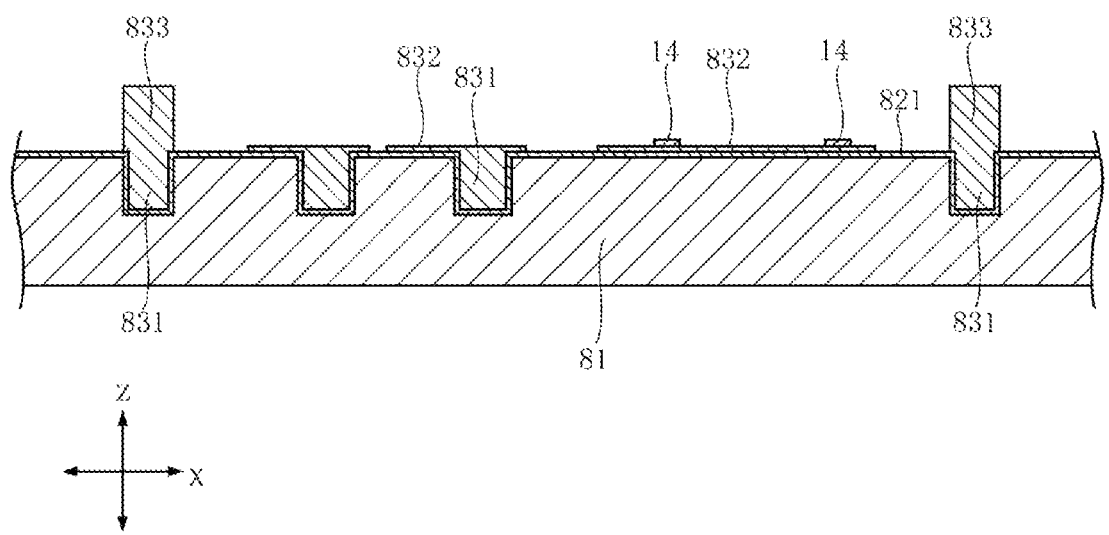
FIG. 16 is a cross-sectional view illustrating a manufacturing process of the semiconductor device illustrated in FIG. 1.

Next, as illustrated in FIG. 16, a plurality of third wiring layers 833, which is connected to the plurality of first wiring layers 831 without being connected to the plurality of second wiring layers 832, is formed. The plurality of third wiring layers 833 is formed in a columnar shape by electrolytic plating using the first underlying layer 821 and the plurality of first wiring layers 831 connected to the plurality of third wiring layers 833 as conductive paths. The third wiring layers 833 are made of copper.

Figure 17:
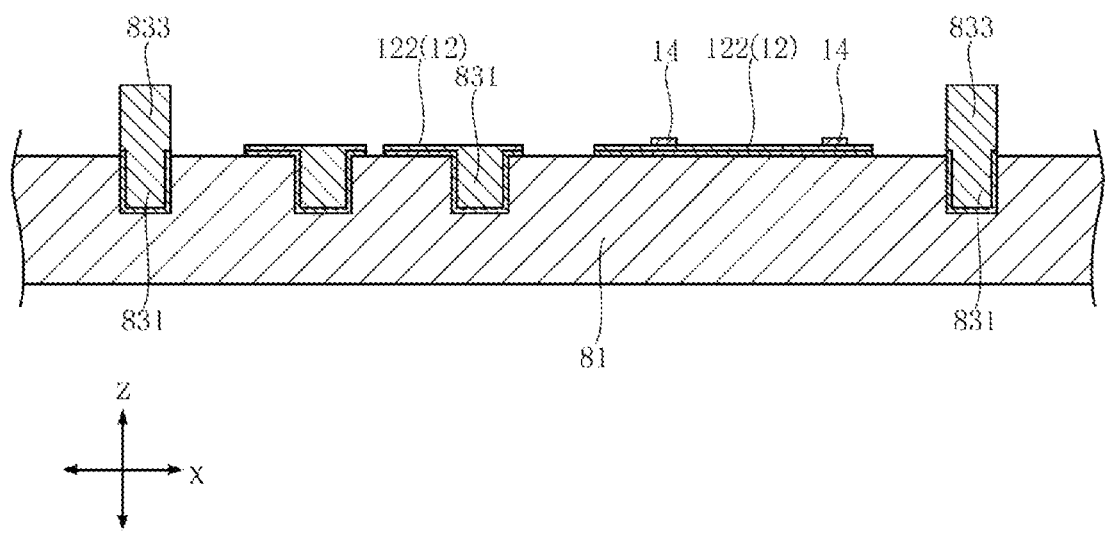
FIG. 17 is a cross-sectional view illustrating a manufacturing process of the semiconductor device illustrated in FIG. 1.

Next, as illustrated in FIG. 17, a portion of the first underlying layer 821 is removed. The removal target is a portion which is not covered by any of the plurality of second wiring layers 832 and the plurality of third wiring layers 833. The first underlying layer 821 is removed by wet etching using a mixed solution of sulfuric acid ($H_2SO_4$) and hydrogen peroxide ($H_2O_2$). Through this step, the plurality of second wiring layers 832 and the plurality of first underlying layer 821 in contact with the plurality of second wiring layers 832 become the mounted parts 122 of the plurality of first wirings 12.

Figure 18:
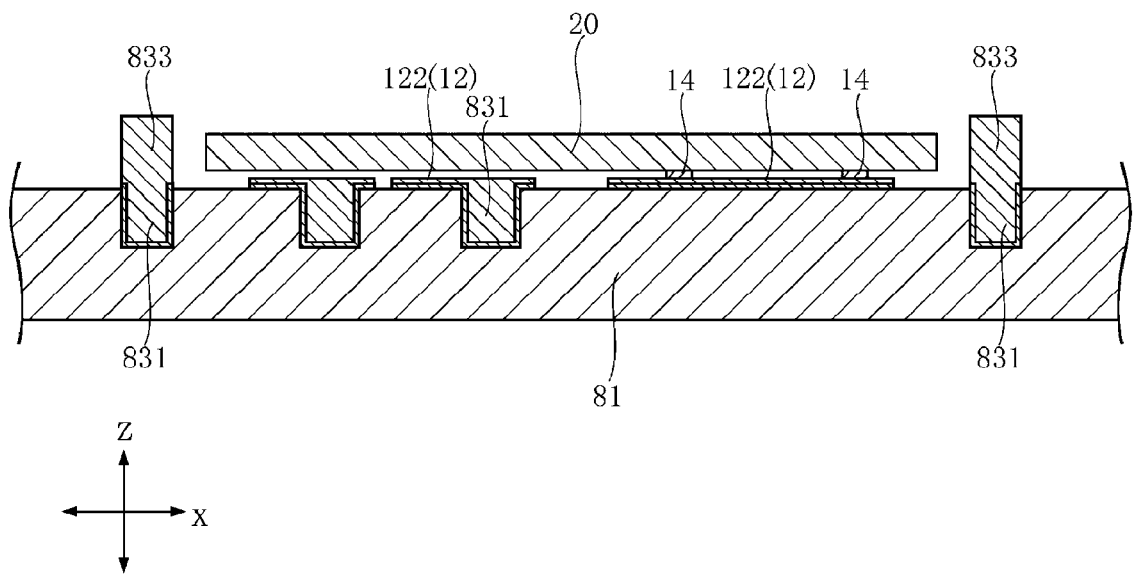
FIG. 18 is a cross-sectional view illustrating a manufacturing process of the semiconductor device illustrated in FIG. 1.

Next, as illustrated in FIG. 18, the semiconductor element 20 is bonded to the mounted parts 122 of the plurality of first wirings 12. In this step, the semiconductor element 20 is mounted by flip chip bonding. First, the plurality of electrodes 21 of the semiconductor element 20 are temporarily attached to the plurality of first bonding layers 14 using a flip chip bonder. Next, the plurality of first bonding layers 14 are melted by reflow. Finally, the bonding of the semiconductor element 20 is completed by solidifying the plurality of first bonding layers 14 by cooling.

Figure 19:
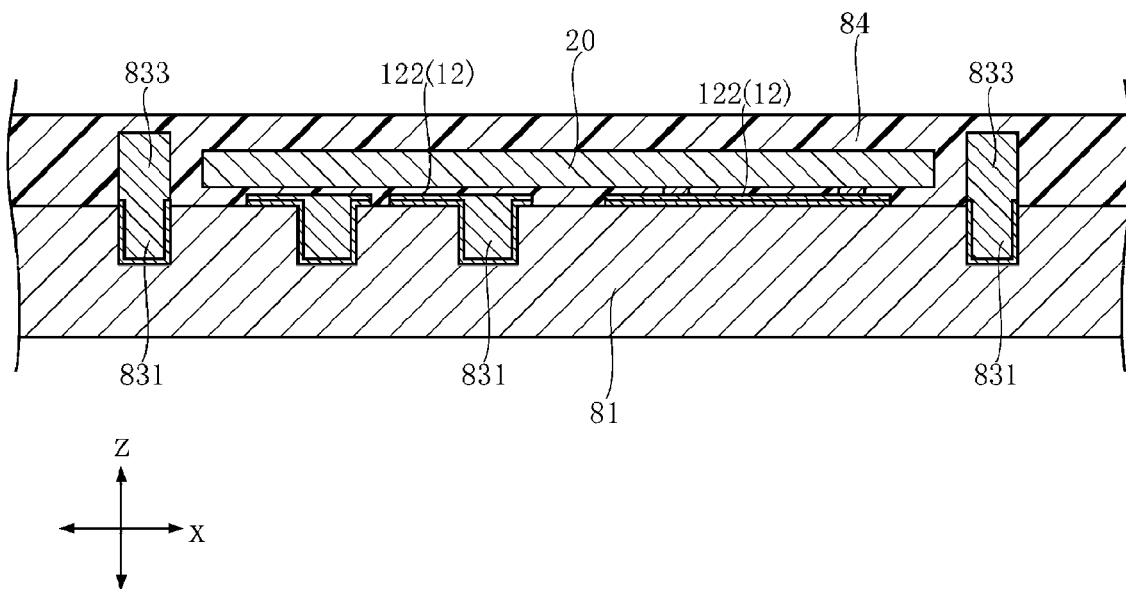
FIG. 19 is a cross-sectional view illustrating a manufacturing process of the semiconductor device illustrated in FIG. 1.

Next, as illustrated in FIG. 19, a sealing resin 84 covering the mounted parts 122 of the plurality of first wirings 12, the semiconductor element 20, and the plurality of third wiring layers 833 is formed on one side of the base material 81 in the thickness direction z. The sealing resin 84 is formed by compression molding. The sealing resin 84 is made of an insulating material containing a black epoxy resin.

Figure 20:
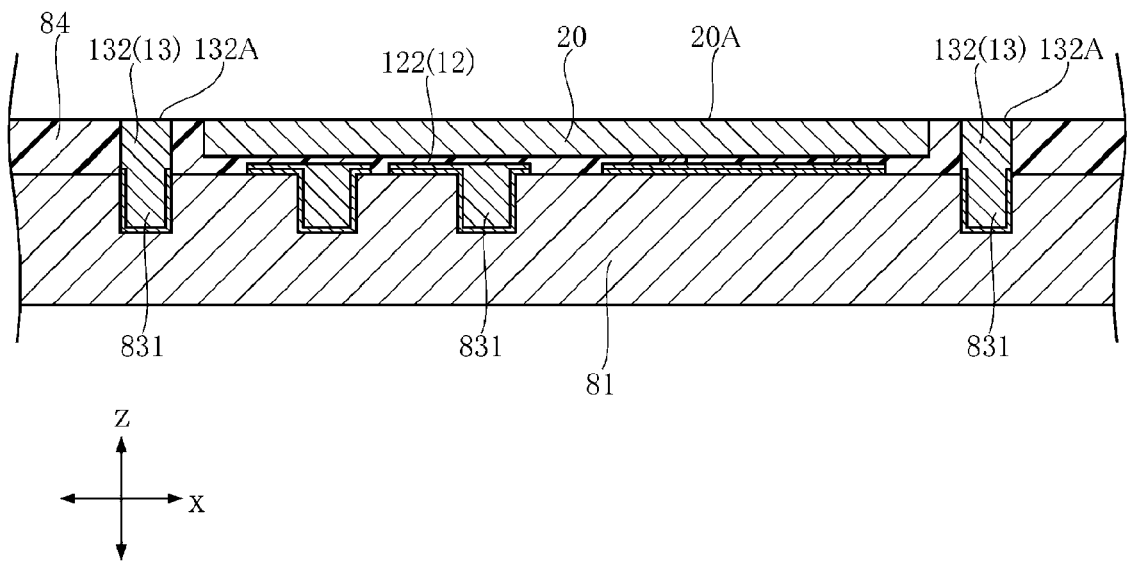
FIG. 20 is a cross-sectional view illustrating a manufacturing process of the semiconductor device illustrated in FIG. 1.

Next, as illustrated in FIG. 20, one side of the sealing resin 84 in the thickness direction z is partially removed by mechanical grinding. In this step, the plurality of third wiring layers 833 are also partially removed. Through this step, the plurality of third wiring layers 833 become the columnar parts 132 of the plurality of second wirings 13. In addition, the top surfaces 132A of the plurality of columnar parts 132 and the element surface 20A of the semiconductor element 20 are exposed from the sealing resin 84. At this time, the thickness of the semiconductor element 20 is 40 to 100 μm.

Figure 21:
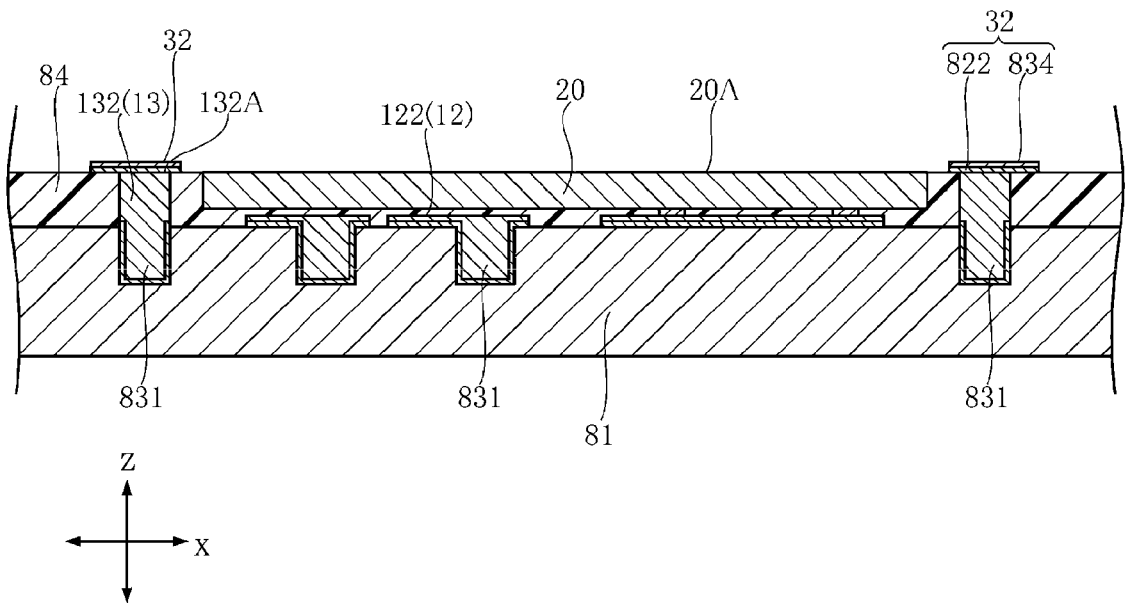
FIG. 21 is a cross-sectional view illustrating a manufacturing process of the semiconductor device illustrated in FIG. 1.

Next, as illustrated in FIG. 21, a pair of rewirings 32, which is in contact with both the top surfaces 132A of the plurality of columnar parts 132 (second wirings 13) and the sealing resin 84, is formed. First, a second underlying layer 822 covering the plurality of top surfaces 132A, the element surface 20A of the semiconductor element 20, and the sealing resin 84 is formed. A configuration and a forming method of the second underlying layer 822 are similar to those of the first underlying layer 821. Next, a pair of fourth wiring layers 834 covering a portion of the second underlying layer 822 is formed. The pair of fourth wiring layers 834 is formed by electrolytic plating using the second underlying layer 822 as a conductive path. The fourth wiring layers 834 are made of copper. Finally, a portion of the second underlying layer 822 is removed. The removal target is a portion that is not covered by the pair of fourth wiring layers 834. The removal method is similar to that of the first underlying layer 821 in the step illustrated in FIG. 18. Through this step, the pair of remaining second underlying layers 822 and the pair of fourth wiring layers 834 covering them become the pair of rewirings 32.

Figure 22:
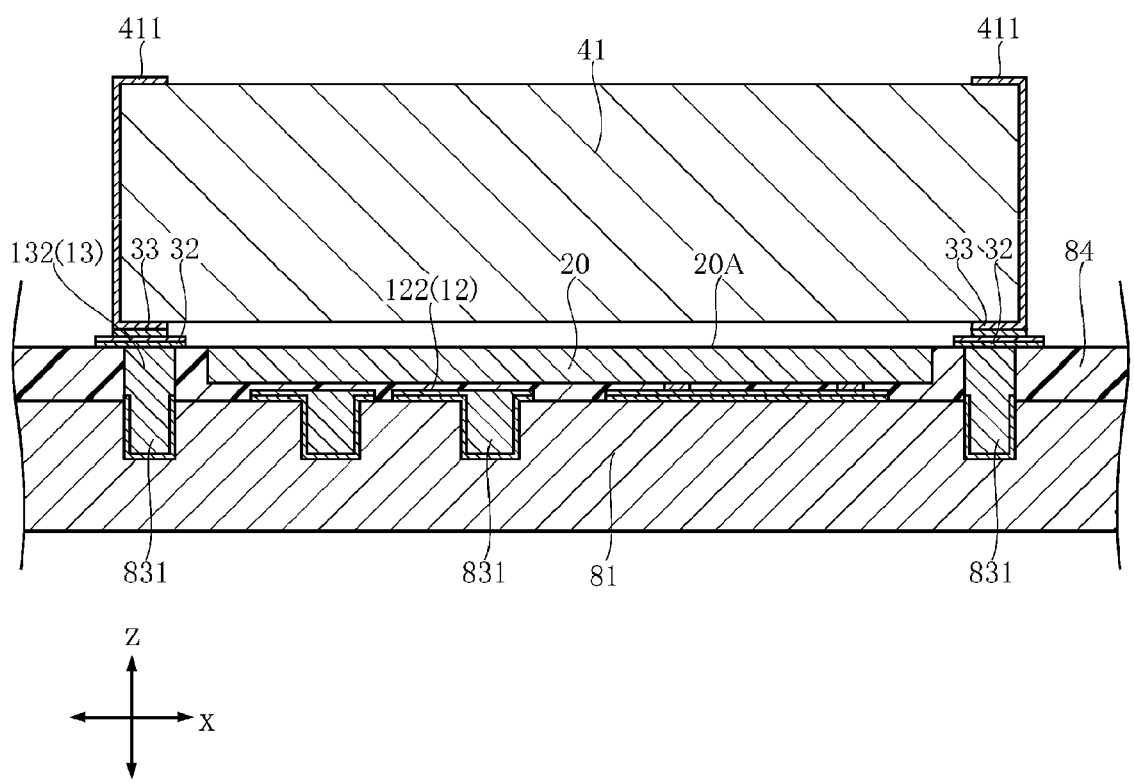
FIG. 22 is a cross-sectional view illustrating a manufacturing process of the semiconductor device illustrated in FIG. 1.

Next, as illustrated in FIG. 22, the passive element 41 is bonded to the pair of rewirings 32. First, a pair of second bonding layers 33 is formed on the pair of rewirings 32. The pair of second bonding layers 33 is formed by printing using a mask. Next, the pair of electrodes 411 of the passive element 41 is brought into contact with the pair of second bonding layers 33, and then the pair of second bonding layers 33 is melted by reflow. Finally, the bonding of the passive element 41 is completed by solidifying the pair of second bonding layers 33 by cooling.

Figure 23:
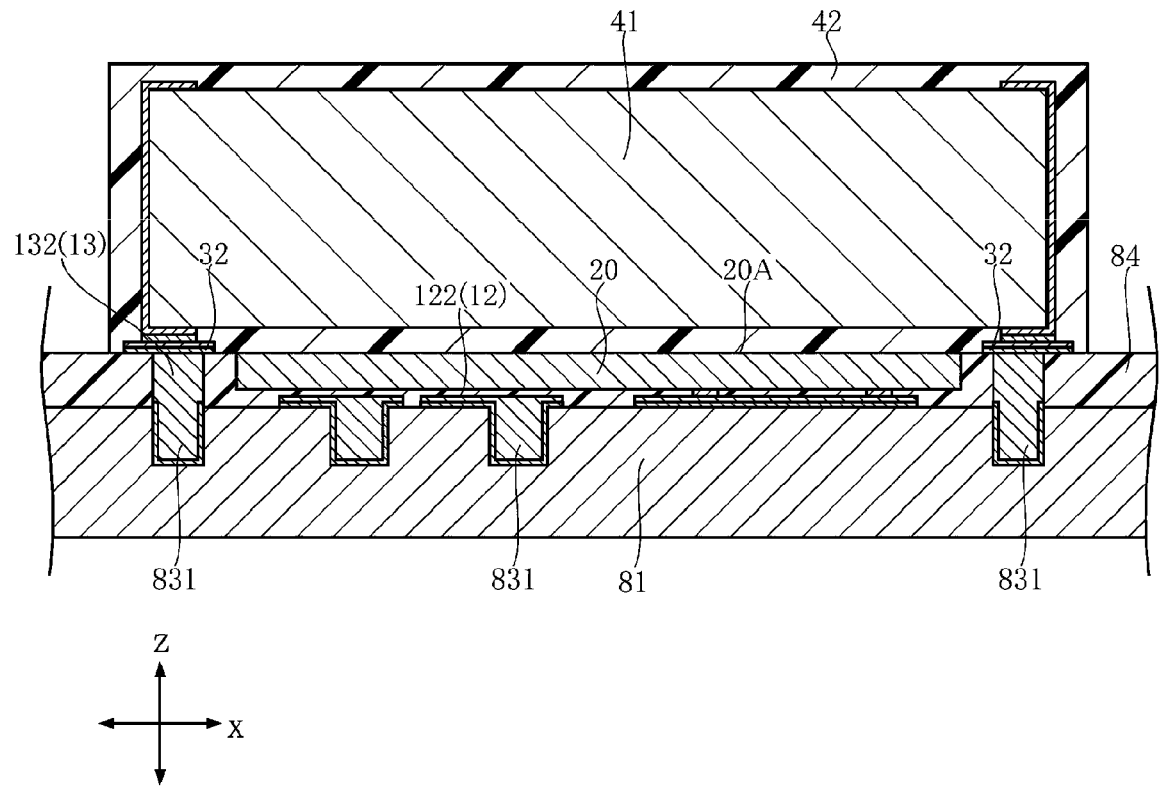
FIG. 23 is a cross-sectional view illustrating a manufacturing process of the semiconductor device illustrated in FIG. 1.

Next, as illustrated in FIG. 23, the second sealing resin 42 covering the pair of rewirings 32 and the passive elements 41 is formed. The second sealing resin 42 is formed by transfer molding. Through this step, the element surface 20A of the semiconductor element 20 and a portion of the surface of the sealing resin 84 are covered with the second sealing resin 42.

Figure 24:
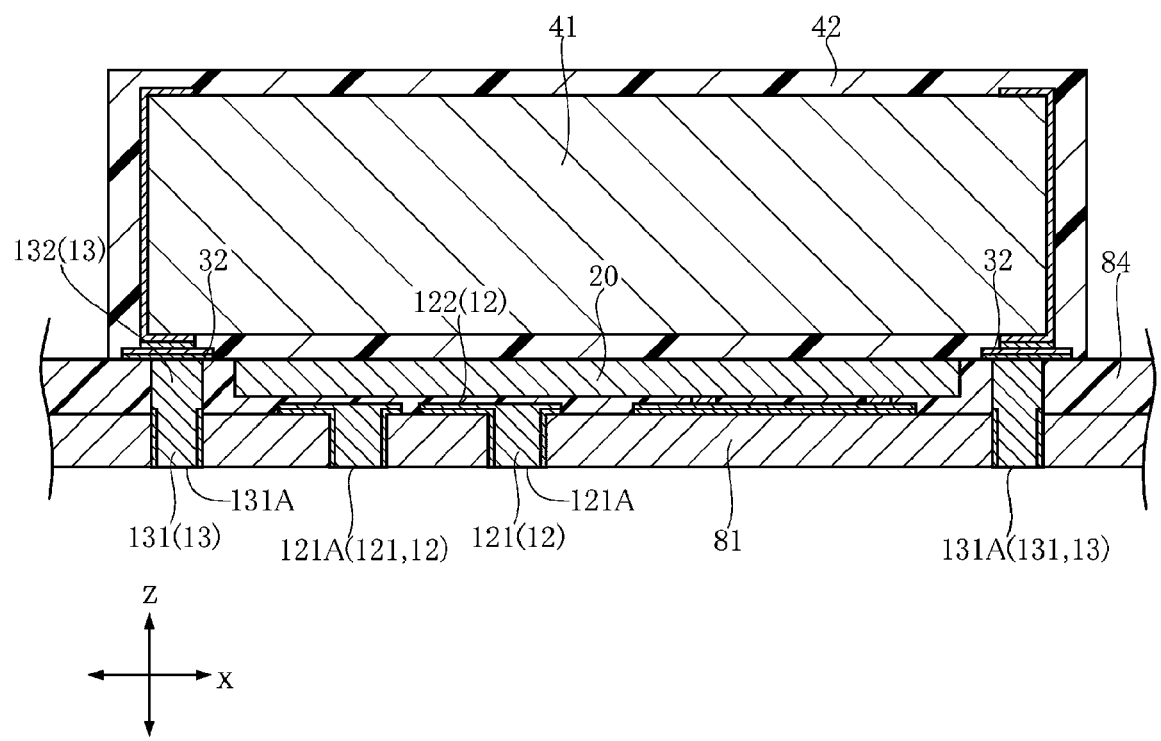
FIG. 24 is a cross-sectional view illustrating a manufacturing process of the semiconductor device illustrated in FIG. 1.

Next, as illustrated in FIG. 24, one side of the base material 81 in the thickness direction z is partially removed by mechanical grinding. In this step, the plurality of first wiring layers 831 and the plurality of first underlying layers 821 in contact with the plurality of first wiring layers 831 are also partially removed. Through this step, the plurality of first wiring layers 831 connected to the mounted parts 122 of the plurality of first wirings 12 and the plurality of first underlying layers 821 in contact with the plurality of first wiring layers 831 become the first embedded parts 121 of the plurality of first wirings 12. The plurality of first wiring layers 831 connected to the columnar parts 132 of the plurality of second wirings 13 and the first underlying layer 821 in contact with the plurality of first wiring layers 831 become the second embedded parts 131 of the plurality of second wirings 13. In addition, the first bottom surfaces 121A of the plurality of first embedded parts 121 and the second bottom surfaces 131A of the plurality of second embedded parts 131 are exposed from the base material 81. At this time, the thickness of the base material 81 is 20 to 100 μm.

Figure 25:
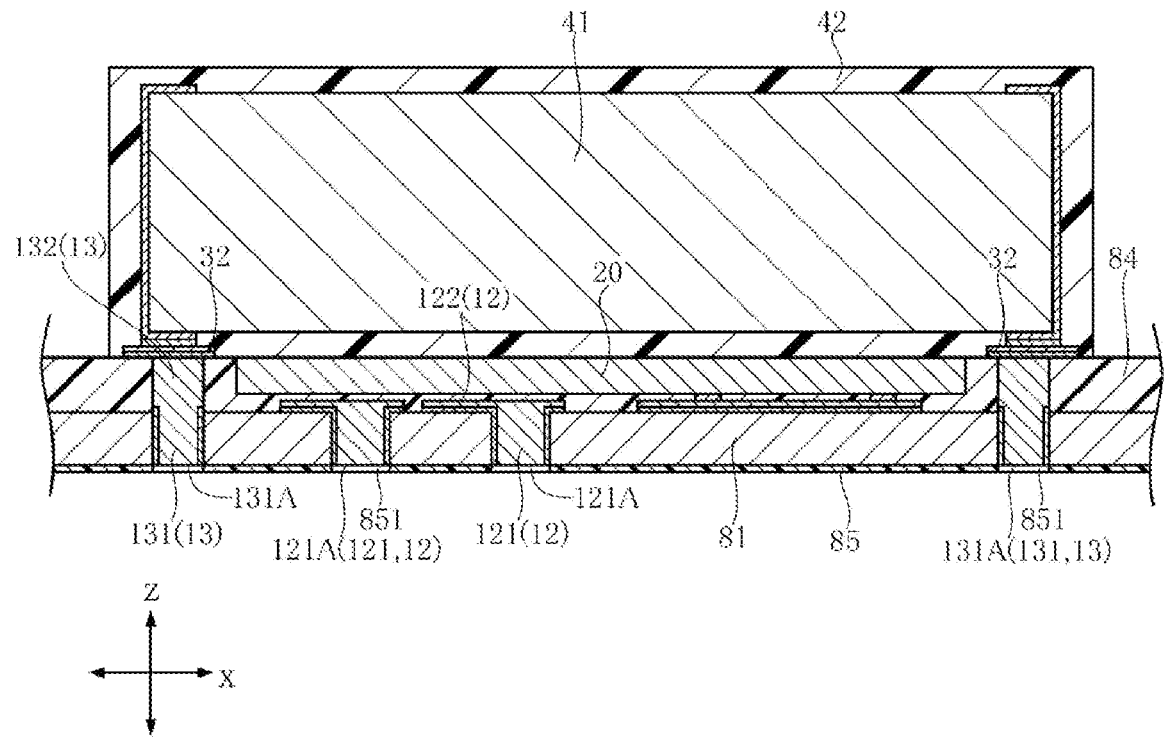
FIG. 25 is a cross-sectional view illustrating a manufacturing process of the semiconductor device illustrated in FIG. 1.

Next, as illustrated in FIG. 25, a protective film 85 covering one surface of the base material 81 in the thickness direction z is formed. The protective film 85 has a plurality of openings 851 penetrating in the thickness direction z. First, photosensitive polyimide is applied to one surface of the base material 81 in the thickness direction z using a spin coater. At this time, the first bottom surfaces 121A of the plurality of first embedded parts 121 (first wiring 12) and the second bottom surfaces 131A of the plurality of second embedded parts 131 (second wirings 13) are covered with the photosensitive polyimide. Next, the plurality of openings 851 are formed in the photosensitive polyimide by lithography patterning. At this time, the first bottom surfaces 121A of the plurality of first embedded parts 121 and the second bottom surfaces 131A of the plurality of second embedded parts 131 are exposed from the plurality of openings 851. Thus, the formation of the protective film 85 is completed.

Figure 26:
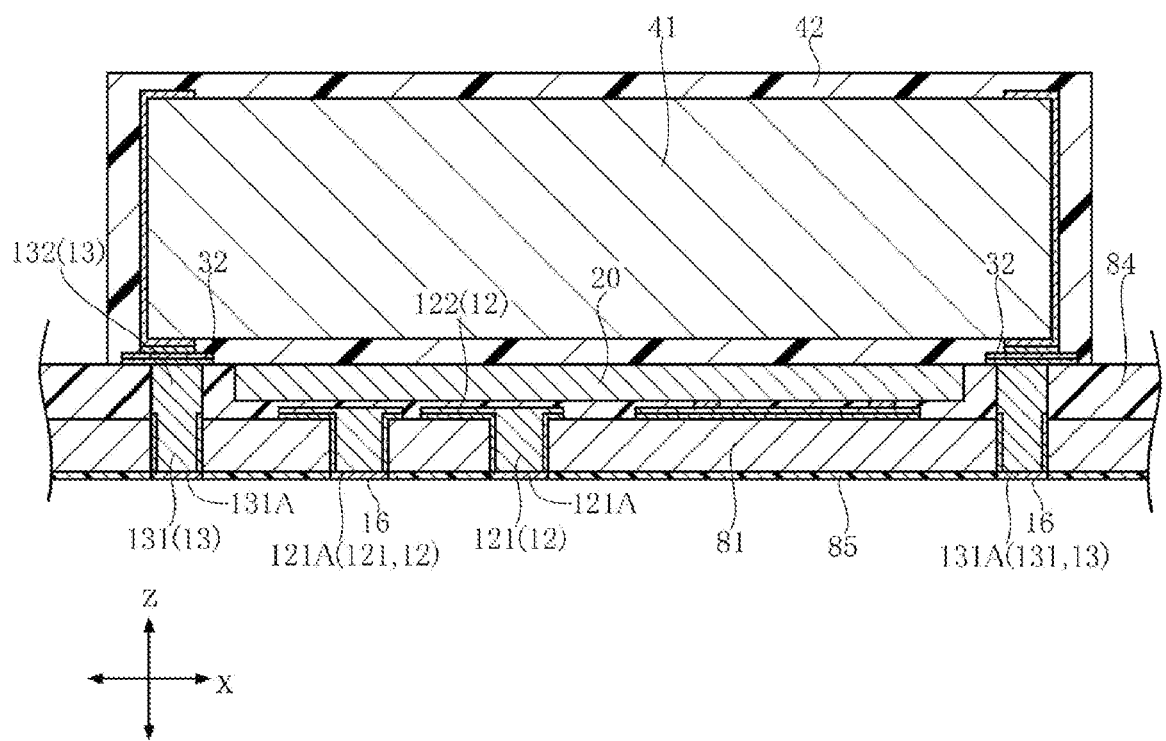
FIG. 26 is a cross-sectional view illustrating a manufacturing process of the semiconductor device illustrated in FIG. 1.

Next, as illustrated in FIG. 26, the first bottom surfaces 121A of the plurality of first embedded parts 121 (first wirings 12) and the second bottom surfaces 131A of the plurality of second embedded parts 131 (second wirings 13) form a plurality of terminals 16 which are individually in contact with each other. The plurality of terminals 16 are formed by electroless plating.

Figure 27:
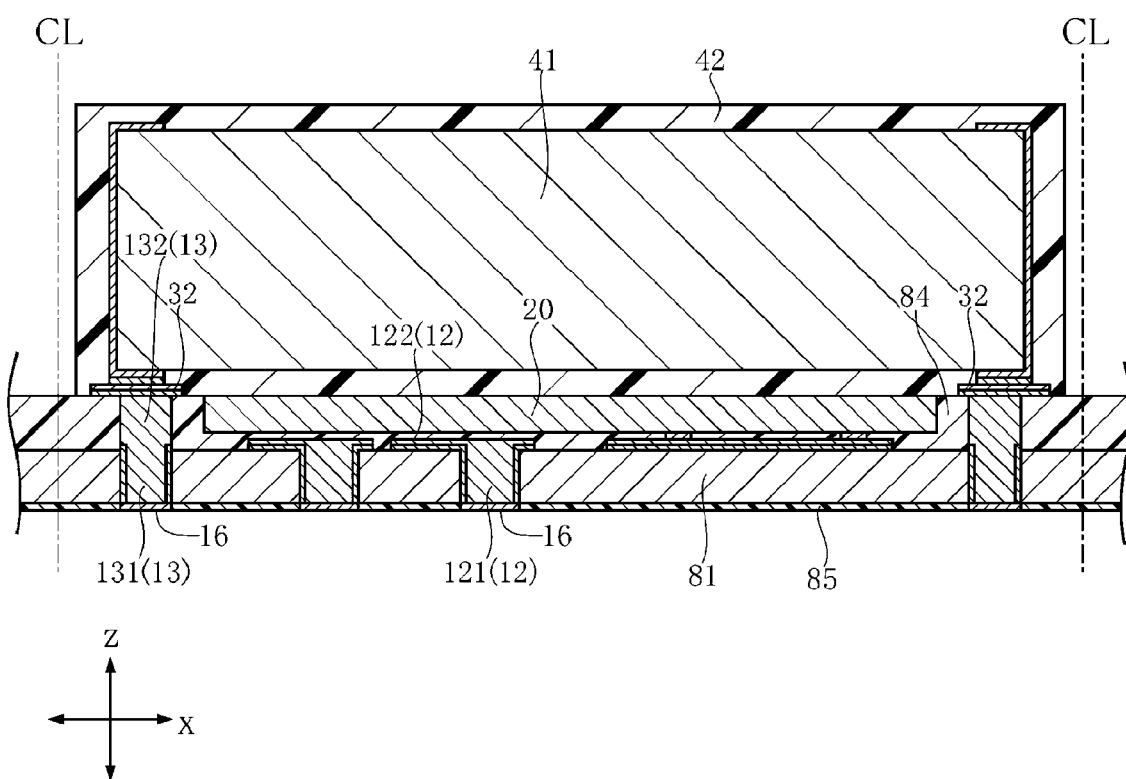
FIG. 27 is a cross-sectional view illustrating a manufacturing process of the semiconductor device illustrated in FIG. 1.

Finally, as illustrated in FIG. 27, the base material 81, the sealing resin 84, and the protective film 85 are cut along a cutting line CL by a dicing blade or the like so as to be divided into a plurality of pieces. The pieces are configured to include one semiconductor element 20 and one passive element 41. Through this step, the base material 81, the sealing resin 84, and the protective film 85, which have become individual pieces, become the substrate 11, the first sealing resin 31, and the protective film 15, respectively. The semiconductor device A10 is manufactured through the above steps.

Next, operational effects of the semiconductor device A10 will be described.

The semiconductor device A10 includes the plurality of second wirings 13 located outward from the semiconductor element 20 as viewed in the thickness direction z. Each of the plurality of second wirings 13 has the columnar part 132. The columnar part 132 protrudes from the second embedded part 131 to the side which the main surface 11A of the substrate 11 faces in the thickness direction z. The semiconductor device A10 includes the passive element 41 that is located on the side facing the main surface 11A faces in the thickness direction z rather than the semiconductor element 20, and is electrically connected to the plurality of second wirings 13. A portion of the passive element 41 overlaps the semiconductor element 20 as viewed in the thickness direction z. The passive element 41 is supported by the plurality of columnar parts 132. Therefore, in the semiconductor device A10, since the semiconductor element 20 and the passive element 41 are arranged in two stages along the thickness direction z, the expansion in the dimension of the semiconductor device A10 viewed in the thickness direction z is suppressed. Thus, according to the semiconductor device A10, it is possible to suppress enlargement of the device even when the semiconductor element 20 and the passive element 41 are mounted.

The semiconductor element 20 has the plurality of electrodes 21 installed on the element rear surface 20B. The plurality of electrodes 21 are bonded to the mounted parts 122 of the plurality of first wirings 12. Therefore, in the semiconductor device A10, a plurality of wires are unnecessary in the conductive paths between the semiconductor element 20 and the plurality of first wirings 12. This is effective in suppressing enlargement of the dimension of the semiconductor device A10 viewed along the thickness direction z.

The substrate 11 is made of an intrinsic semiconductor material such as a silicon wafer or the like. Accordingly, the first embedded parts 121 of the plurality of first wirings 12 and the second embedded parts 131 of the plurality of second wirings 13 can be formed using a method similar to that for manufacturing the semiconductor element 20. Therefore, it is possible to reduce the dimension of semiconductor device A10 viewed along the thickness direction z, compared with the case of using a lead frame. Furthermore, it is possible to reduce the thickness of the substrate 11 compared with the case of using a glass epoxy substrate.

Each of the first embedded parts 121 of the plurality of first wirings 12 has the first bottom surface 121A facing the same side as the rear surface 11B of the substrate 11 in the thickness direction z. Each of the second embedded parts 131 of the plurality of second wirings 13 has the second bottom surface 131A facing the same side as the rear surface 11B in the thickness direction z. The plurality of first bottom surfaces 121A and the plurality of second bottom surfaces 131A are flush with the rear surface 11B. Thus, the thickness of the substrate 11 can be further reduced.

The plurality of second wirings 13 are located on both sides of the semiconductor element 20 in the first direction x. Therefore, since the passive element 41 is configured to straddle the semiconductor element 20 and also the portion of the passive element 41, which overlaps the semiconductor element 20 as viewed in the thickness direction z, is increased, it is possible to effectively suppress expansion of the dimension of the semiconductor device A10 viewed along the thickness direction z.

The semiconductor device A10 further includes the first sealing resin 31 covering a portion of each of the substrate 11, the plurality of first wirings 12, the semiconductor element 20, and the plurality of second wirings 13. The first sealing resin 31 has the outer surface 31A facing the same side as the main surface 11A of the substrate 11 in the thickness direction z. The top surfaces 132A of the plurality of columnar parts 132 (second wirings 13) and the element surface 20A of the semiconductor element 20 are flush with the outer surface 31A. Thus, the height (dimension in the thickness direction z) of the plurality of columnar parts 132 can be made as small as possible within a range that does not interfere with the semiconductor element 20. Therefore, it is possible to suppress the expansion of the dimension of the semiconductor device A10 in the thickness direction z.

The semiconductor device A10 further includes the pair of rewirings 32 which are separated from each other in the first direction x. The pair of rewirings 32 are in contact with the outer surface 31A of the first sealing resin 31 and the top surfaces 132A of the plurality of columnar parts 132 (second wirings 13). The passive element 41 is bonded to the pair of rewirings 32. Therefore, since the bonding area of the pair of electrodes 411 of the passive element 41 is increased, it is possible to improve the bonding strength compared with the case where the passive element 41 is directly bonded to the plurality of top surfaces 132A.

The semiconductor device A10 further includes the second sealing resin 42 covering the passive element 41. A portion of the second sealing resin 42 is interposed between the semiconductor element 20 and the passive element 41. When the passive element 41 is an inductor, noise is generated from the passive element 41 when the semiconductor device A10 is used. Therefore, since the noise propagated from the passive element 41 to the semiconductor element 20 is reduced, it is possible to suppress a switching delay or the like of the semiconductor element 20.

The substrate 11 has the plurality of end surfaces 11C connected to both the main surface 11A and the rear surface 11B and facing a direction orthogonal to the thickness direction z. The plurality of end surfaces 11C is located outward from the second sealing resin 42 as viewed in the thickness direction z. Thus, in the process of manufacturing the semiconductor device A10 illustrated in FIG. 28, it is possible to prevent the dicing blade or the like from being in contact with the second sealing resin 42 when cutting the base material 81, the sealing resin 84, and the protective film 85.

The semiconductor device A10 includes the plurality of terminals 16 which are individually in contact with the first bottom surfaces 121A of the plurality of first embedded parts 121 (first wirings 12) and the second bottom surfaces 131A of the plurality of second embedded parts 131 (second wirings 13). Therefore, when the semiconductor device A10 is mounted on the wiring board, it is possible to prevent the plurality of first embedded parts 121 and the plurality of second embedded parts 131 from thermal shock caused by solder bonding.

Second Embodiment

Figure 29:
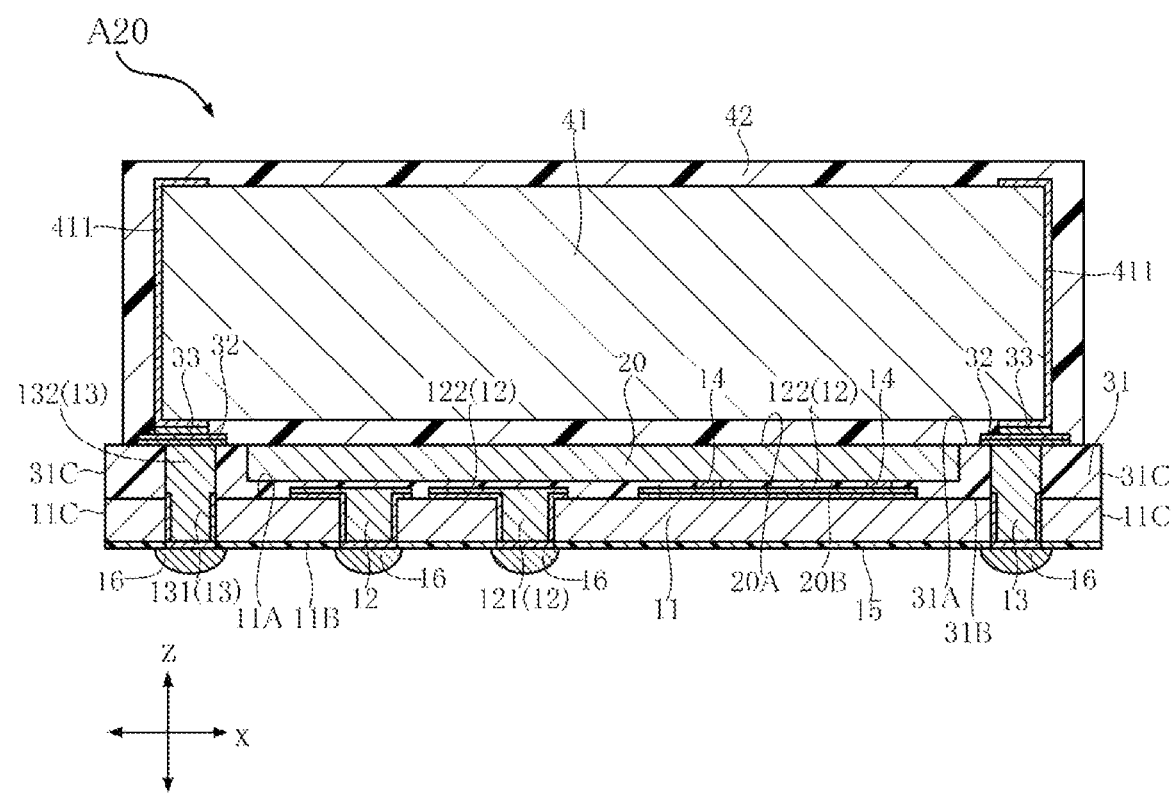
FIG. 29 is a cross-sectional view of the semiconductor device illustrated in FIG. 28.
Figure 30:
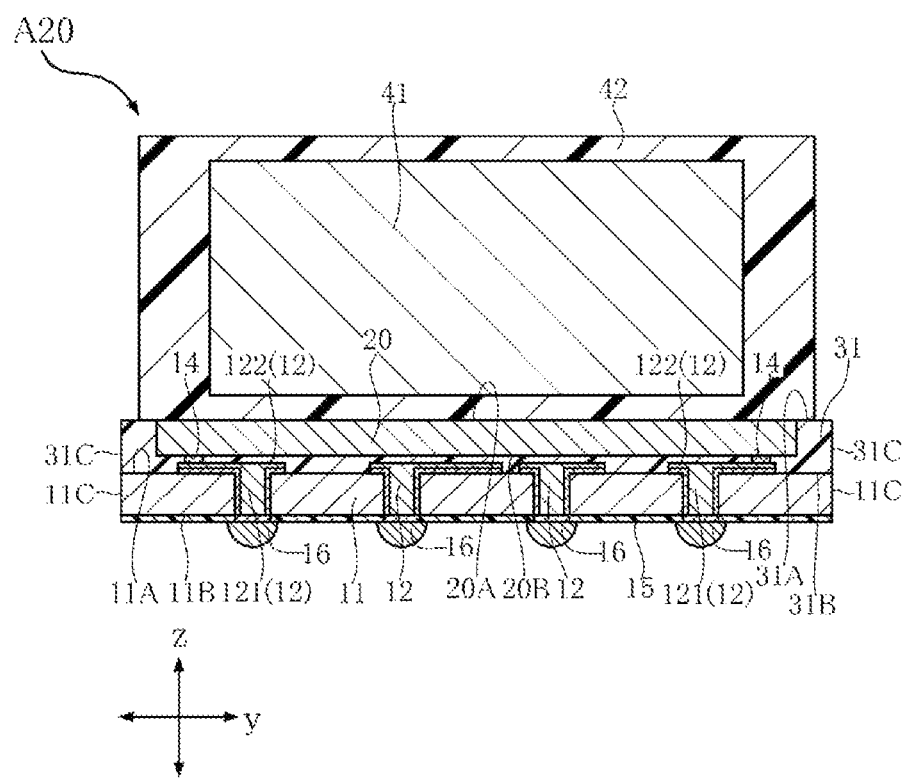
FIG. 30 is a cross-sectional view of the semiconductor device illustrated in FIG. 28.

A semiconductor device A20 according to a second embodiment of the present disclosure will be described with reference to FIGS. 28 to 32. In these drawings, the same or similar elements as those of the semiconductor device A10 described above are denoted by the same reference numerals and a repeated description thereof will be omitted. Here, the position of the cross section in FIG. 29 is similar to the position of the cross section in FIG. 7 of the semiconductor device A10 described above. The position of the cross section in FIG. 30 is similar to the position of the cross section in FIG. 8 of the semiconductor device A10 described above.

In the semiconductor device A20, the configuration of the plurality of terminals 16 is different from the configuration in the semiconductor device A10 described above.

Figure 28:
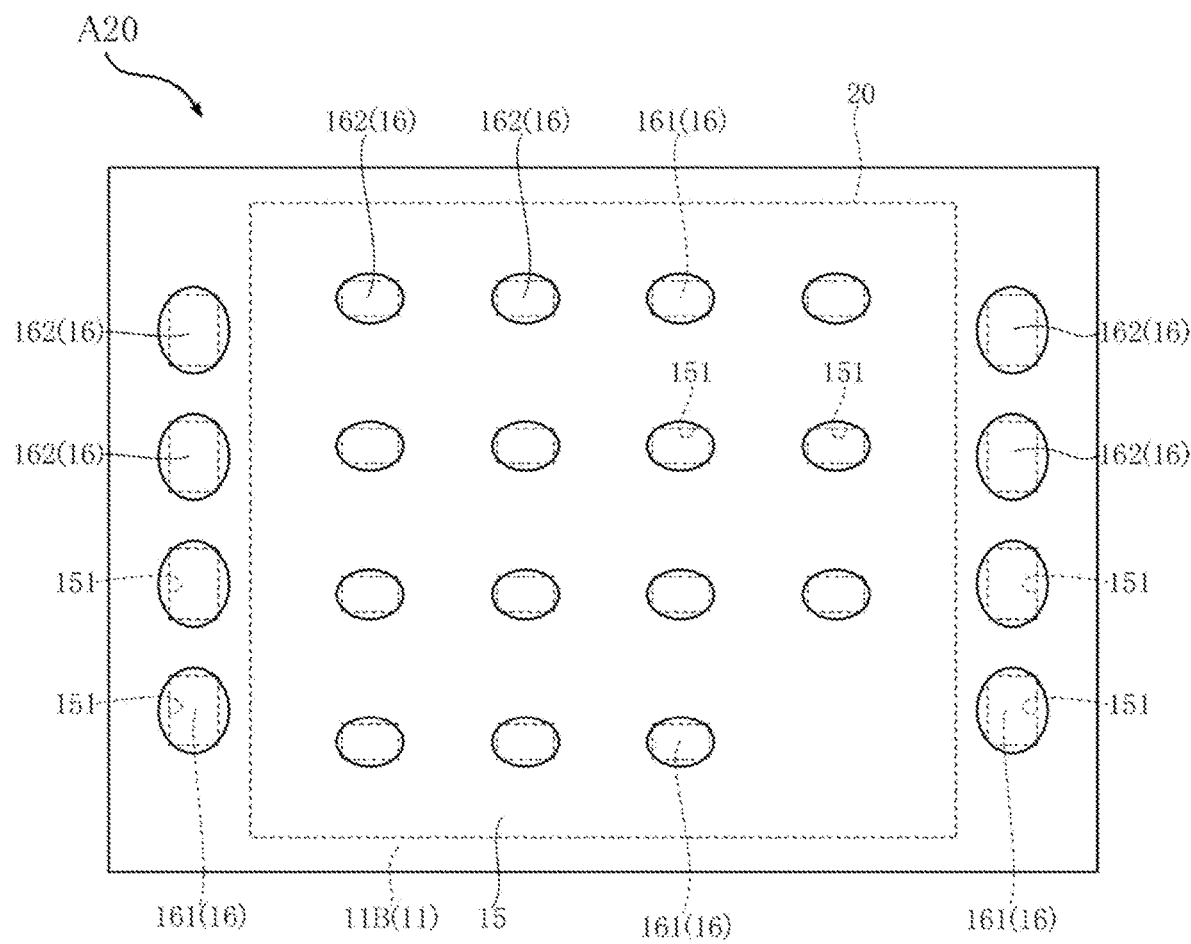
FIG. 28 is a bottom view of a semiconductor device according to a second embodiment of the present disclosure.
Figure 31:
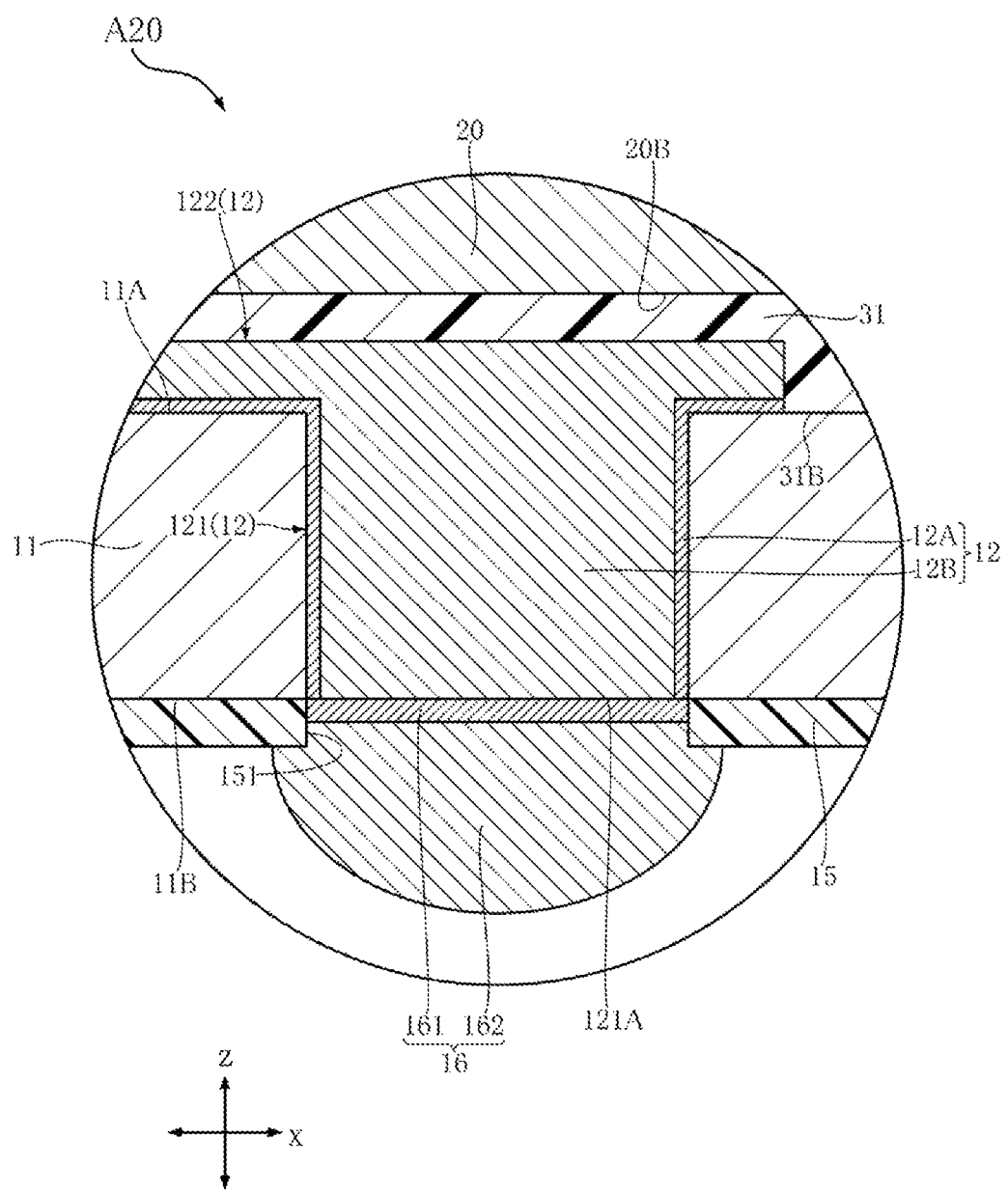
FIG. 31 is a partially enlarged view of FIG. 29.
Figure 32:
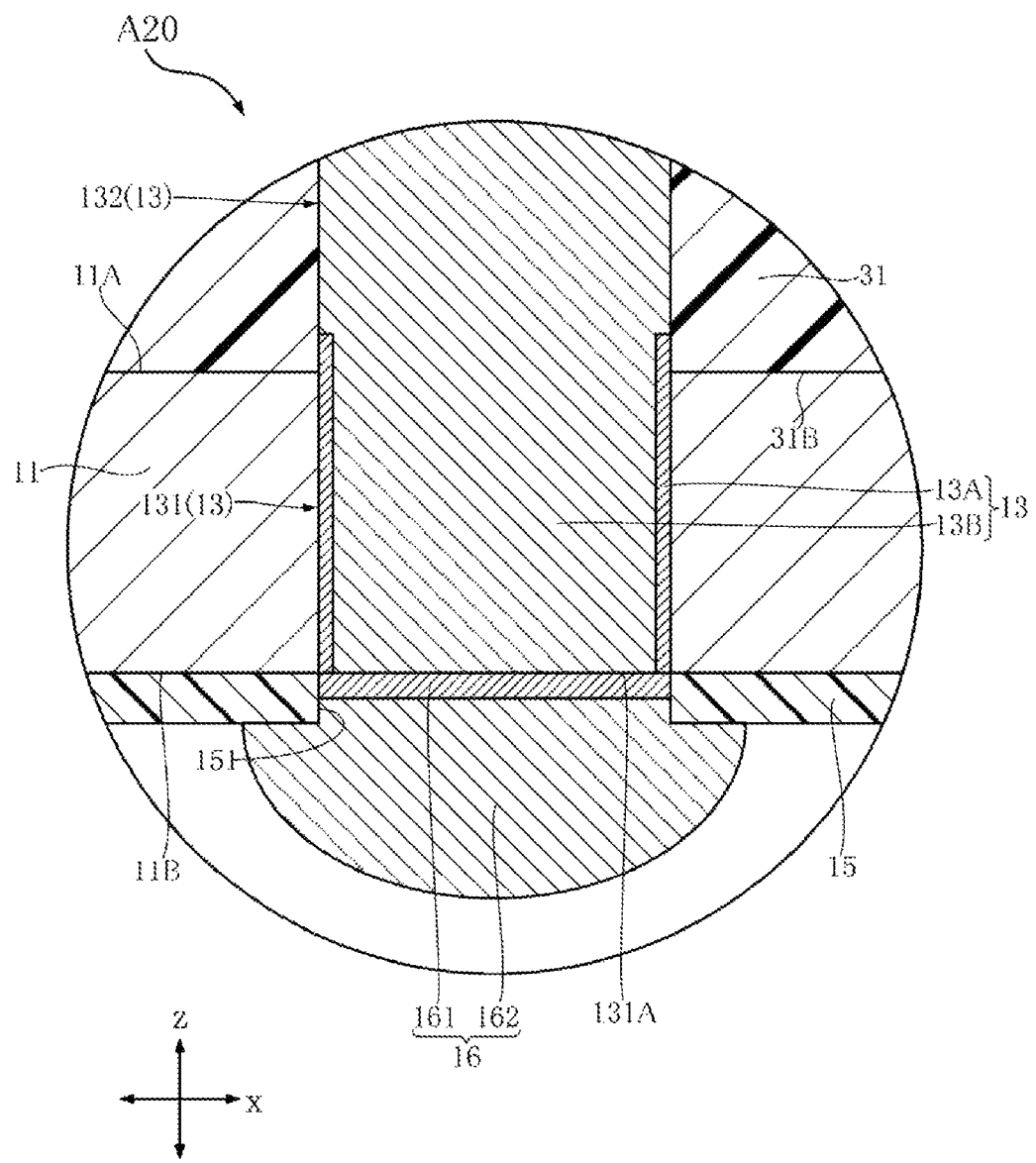
FIG. 32 is a partially enlarged view of FIG. 29.

As illustrated in FIGS. 28, 31, and 32, each of the plurality of terminals 16 has a base part 161 and a bump part 162. The base part 161 is in contact with either the first bottom surfaces 121A of the plurality of first embedded parts 121 (first wirings 12) or the second bottom surfaces 131A of the plurality of second embedded parts 131 (second wirings 13). The base part 161 includes a nickel layer which is in contact with either the first bottom surfaces 121A or the second bottom surfaces 131A, a palladium layer stacked on the nickel layer, and a gold layer stacked on the palladium layer. Furthermore, the base part 161 may be configured so that the gold layer is directly stacked on the nickel layer without having the palladium layer. Therefore, the base part 161 contains gold. The bump part 162 protrudes from the base part 161 to the side which the rear surface 11B of the substrate 11 faces in the thickness direction z. The bump part 162 has a hemispherical shape. The bump part 162 contains tin.

Next, operational effects of the semiconductor device A20 will be described.

Similar to the semiconductor device A10, the semiconductor device A20 includes the plurality of second wirings 13 which are located outward from the semiconductor element 20 as viewed in the thickness direction z. Each of the plurality of second wirings 13 has the columnar part 132. The columnar part 132 protrudes from the second embedded part 131 to the side which the main surface 11A of the substrate 11 faces in the thickness direction z. The semiconductor device A20 includes the passive element 41 located on the side facing the main surface 11A in the thickness direction z rather than the semiconductor element 20, and electrically connected to the plurality of second wirings 13. A portion of the passive element 41 overlaps the semiconductor element 20 as viewed in the thickness direction z. The passive element 41 is supported by the plurality of columnar parts 132. Therefore, it is possible to suppress enlargement of the device even when the semiconductor element 20 and the passive element 41 are mounted on the semiconductor device A20.

In the semiconductor device A20, each of the plurality of terminals 16 includes the base part 161 and the bump part 162. The base part 161 is in contact with either the first bottom surfaces 121A of the plurality of first embedded parts 121 (first wirings 12) or the second bottom surfaces 131A of the plurality of second embedded parts 131 (second wirings 13). The base part 161 contains gold. The bump part 162 protrudes from the base part 161 to the side which the rear surface 11B of the substrate 11 faces in the thickness direction z. The bump part 162 contains tin. Thus, the semiconductor device A20 can be mounted on the wiring board without using solder. In addition, when mounting the semiconductor device A20, it is possible to protect the plurality of first embedded parts 121 and the plurality of second embedded parts 131 from thermal shock that acts on the bump part 162 by the base part 161.

According to the present disclosure in some embodiments, it is possible to suppress enlargement of a device even when a semiconductor element and a passive element are mounted.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a base substrate having a first surface and a second surface facing opposite sides to each other in a thickness direction, wherein the first surface has a plurality of external electrodes;
   a plurality of interconnections in the base substrate, each of the interconnections being electrically connected to at least one of the external electrodes on the first surface;

a first electric element having a third surface facing the second surface of the base substrate and a plurality of electrodes installed on the third surface, and having a fourth surface facing opposite side to the third surface in the thickness direction;

a plurality of columnar parts arranged on the second surface of the base substrate outside of an area where the first electric element faces the second surface of the base substrate; and a second electric element having a plurality of electrodes and located at least partially over the fourth surface of the first electric element, wherein the plurality of electrodes of the second electric element are located apart in a first direction orthogonal to the thickness direction, and the plurality of electrodes of the second electric element are respectively connected to the plurality of columnar parts arranged in a second direction orthogonal to both the first direction and the thickness direction.

2. The semiconductor device according to claim 1, further comprising a first sealing resin covering a portion of the base substrate, a portion of the plurality of the columnar parts, and a portion of the first electric element.

3. The semiconductor device according to claim 2, wherein the fourth surface of the first electric element is exposed from the first sealing resin and is flush with a top surface of the first sealing resin.

4. The semiconductor device according to claim 2, wherein each of the columnar parts has a top surface facing the same side as the fourth surface of the first electric element in the thickness direction, and wherein the top surface of each of the columnar parts is flush with a top surface of the first sealing resin.

5. The semiconductor device according to claim 4, further comprising a pair of rewiring layers on the top surface of the first sealing resin, wherein one of the rewiring layers connects one of the columnar parts with another one of the columnar parts.

6. The semiconductor device according to claim 5, wherein the pair of rewiring layers is separated from each other in the first direction and the one of the rewiring layers has a band shape extending in the second direction.

7. The semiconductor device according to claim 2, wherein the second electric element is at least partially sealed by a second sealing resin, and a second sealing resin is in contact with a top surface of the first sealing resin.

8. The semiconductor device according to claim 1, wherein as viewed in the thickness direction, a size of one of the interconnections is greater than a size of one of the electrodes on the third surface of the first electric element.

9. The semiconductor device according to claim 1, further comprising substrate rewirings on the second surface of the base substrate, wherein one of the substrate rewirings connects one of the interconnections in the base substrate with another one of the interconnections in the base substrate.

10. The semiconductor device according to claim 9, wherein the one of the substrate rewirings connects the one of the interconnections with another one of the interconnections next to the one of the interconnections in the first direction.

11. The semiconductor device according to claim 10, wherein the one of the substrate rewirings further connects the one of the interconnections with second another one of the interconnections next to the one of the interconnections in the second direction.

12. The semiconductor device according to claim 11, wherein another one of the substrate rewirings connects third another one of the interconnections with fourth another one of the interconnections next to the third another one of the interconnections in the first direction.

13. The semiconductor device according to claim 3, wherein the second electric element is mounted on the top surface of the first sealing resin, and a portion of the second electric element overlaps the first electric element as viewed in the thickness direction.

14. The semiconductor device according to claim 7, wherein a portion of the second sealing resin is interposed between the first electric element and the second electric element.

15. The semiconductor device according to claim 1, wherein the base substrate is a glass epoxy substrate.

16. The semiconductor device according to claim 1, wherein a thickness of the first electric element is 40 to 100 micrometers, and a thickness of the base substrate is 20 to 100 micrometers.

17. The semiconductor device according to claim 5, wherein the rewiring layers include copper having a thickness of 10 to 30 micrometers.

18. The semiconductor device according to claim 1, further comprising a protective film configured to cover a portion of the first surface of the base substrate, wherein the protective film contains polyimide.

19. The semiconductor device according to claim 2, wherein the first sealing resin contains an epoxy resin.

20. The semiconductor device according to claim 1, wherein the second electric element is an inductor.

21. The semiconductor device according to claim 1, wherein the first electric element is a semiconductor element.

22. The semiconductor device according to claim 1, wherein the second electric element is a passive element.

* * * * *